US008567909B2

(12) United States Patent
Sieber

(10) Patent No.: US 8,567,909 B2
(45) Date of Patent: Oct. 29, 2013

(54) PRINTHEAD FOR INKJET PRINTING DEVICE

(75) Inventor: Kurt D. Sieber, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 62 days.

(21) Appl. No.: 13/228,881

(22) Filed: Sep. 9, 2011

(65) Prior Publication Data
US 2013/0063525 A1    Mar. 14, 2013

(51) Int. Cl.
*B41J 2/14* (2006.01)
*B41J 2/05* (2006.01)

(52) U.S. Cl.
USPC .................................. 347/45; 347/63; 347/64

(58) Field of Classification Search
USPC ............................................................. 347/64
See application file for complete search history.

(56) References Cited

U.S. PATENT DOCUMENTS

| | | | |
|---|---|---|---|
| 1,941,001 A | 12/1933 | Hansell | |
| 3,373,437 A | 3/1968 | Sweet et al. | |
| 3,709,432 A | 1/1973 | Robertson | |
| 4,596,994 A | 6/1986 | Matsuda et al. | |
| 6,079,821 A | 6/2000 | Chwalek et al. | |
| 6,502,925 B2 | 1/2003 | Anagnostopoulos et al. | |
| 6,588,888 B2 | 7/2003 | Jeanmaire et al. | |
| 6,786,575 B2 | 9/2004 | Anderson et al. | |
| 7,426,067 B1 | 9/2008 | Bright et al. | |
| 2010/0079551 A1* | 4/2010 | Saito et al. | 347/64 |
| 2011/0018938 A1 | 1/2011 | Rivas et al. | |
| 2012/0225268 A1* | 9/2012 | Antonov et al. | 428/213 |

OTHER PUBLICATIONS

Beach, et al. "Materials Selection for an Ink Jet Printer," *IBM J. Res Develop.*, Jan. 1977, pp. 75-80.
Lee, et al., "Electrochemical Test to Evaluate Passivation Layers: Overcoats of Si in Ink," *J. Electrochem. Soc.: Electrochemical Science and Technology*, Oct. 1982, pp. 2174-2178.
Gendler, et al., "Adverse Chemical Effects on the Plasma-Deposited Amorphous Silicon Carbide Passivation Layer of Thermal Ink-Jet Thin-Film Heaters," *American Chemical Society, Chem. Mater.* 1991, vol. 3, No. 4, pp. 635-641.
Matero, et al., "Atomic layer deposited thin films for corrosion protection," *J. Phys. IV France* 9 (1999) 493-499.

(Continued)

*Primary Examiner* — Lisa M Solomon
(74) *Attorney, Agent, or Firm* — Andrew J. Anderson; Raymond L. Owens

(57) ABSTRACT

An inkjet printhead is provided for a digitally controlled inkjet printing apparatus wherein the inkjet printhead is comprised of a material layer and a drop formation mechanism positioned in or on the material layer, that is substantially improved in chemical resistance and thermally stability. A chemically resistant and thermally stable multilayer coating is provided onto and in contact with the inkjet printhead, wherein the multilayer coating includes one or more thin film layers comprised primarily of hafnium oxide or zirconium oxide and one or more thin film layers comprised primarily of tantalum oxide, the multilayer coating being located on the material layer. The corrosion resistant film of the invention is particularly beneficial because it can be formed on the printhead using atomic layer deposition film forming methods that produce conformal films that cover complex geometries, thereby enabling the corrosion resistant film to be formed on all surfaces of the printhead that come in contact with inks or other fluids employed in the printing system.

19 Claims, 10 Drawing Sheets

(56) References Cited

OTHER PUBLICATIONS

Almomani, et al., "Pitting corrosion protection of stainless steel by sputter deposited hafnia, alumina, and hafnia-alumina nanolaminate films," *J. Vac. Sci. Technol.* A 27(3), May/Jun. 2009, pp. 449-455.

Hausmann, et al., "Surface morphology and crystallinity control in the atomic layer deposition (ALD) of hafnium and zirconium oxide thin films," *Journal of Crystal Growth* 249 (2003) pp. 251-261.

Kukli, et al., "Tailorinig the dielectric properties of $HfO_2$—$Ta_2O_5$ nanolaminates," *Appl. Phys. Lett.* 68 (26), Jun. 24, 1996, pp. 3737-3739.

* cited by examiner

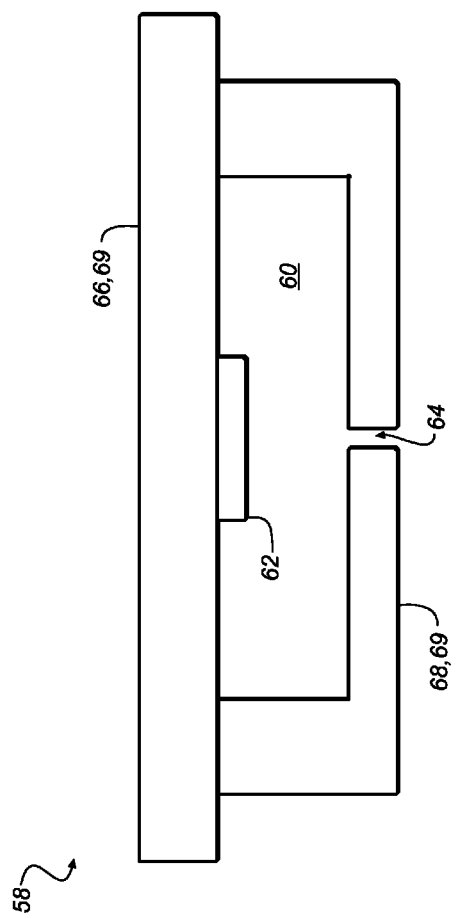

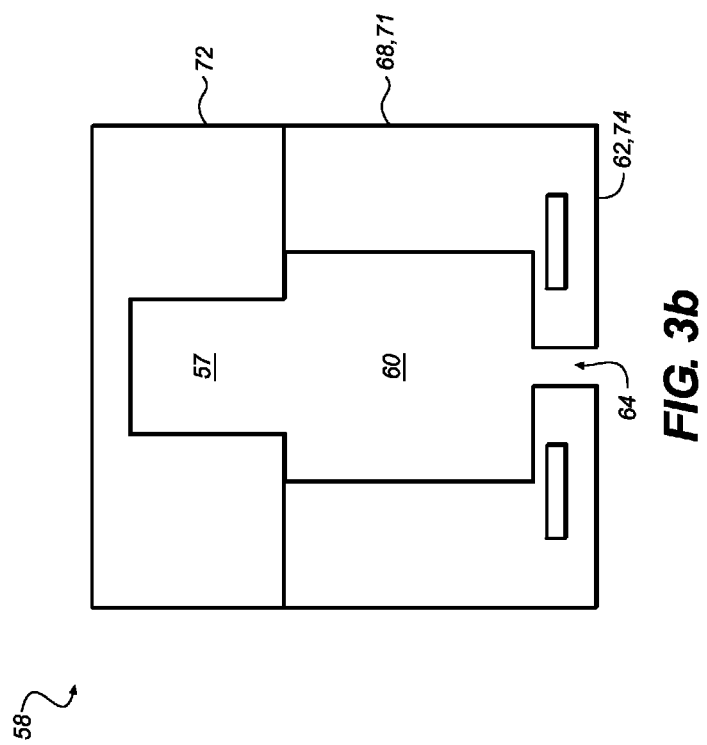

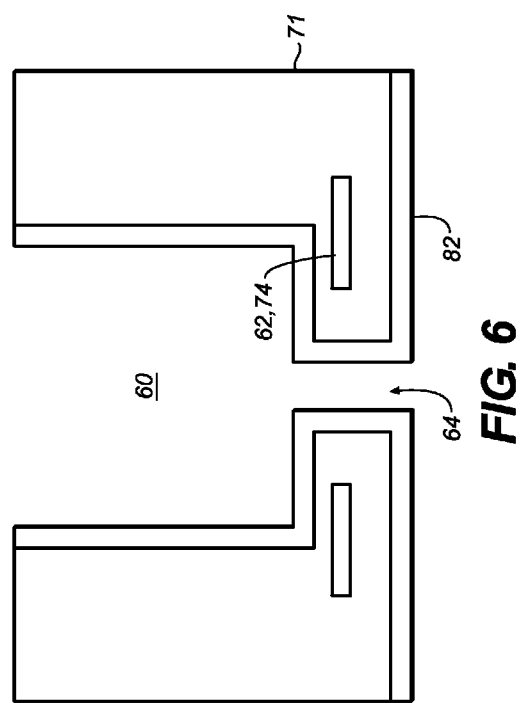

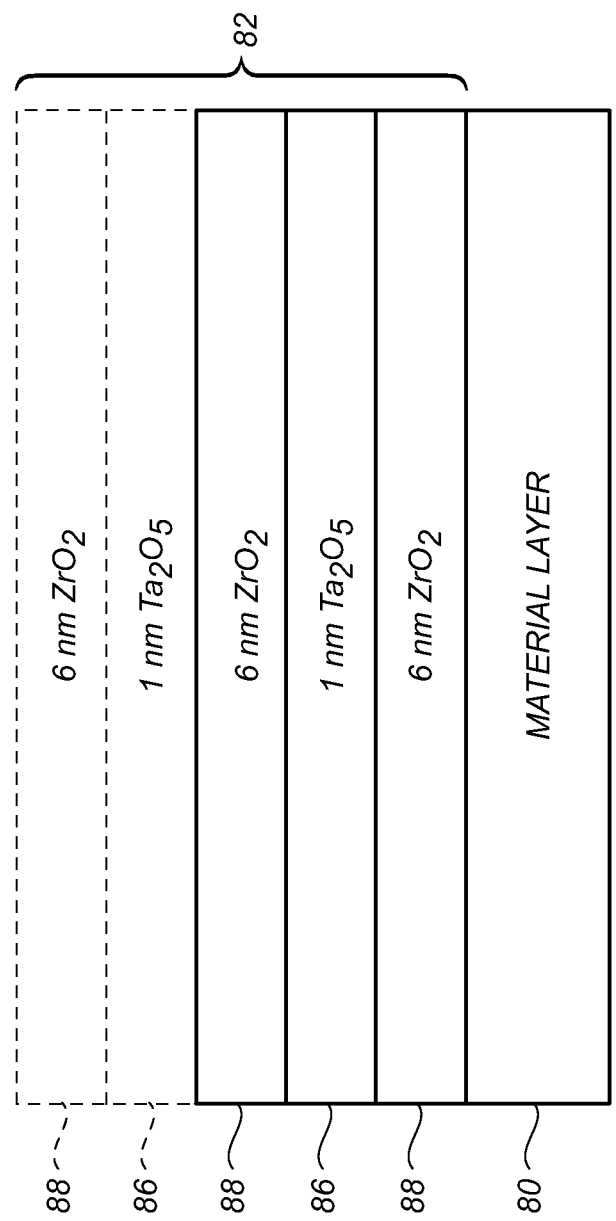

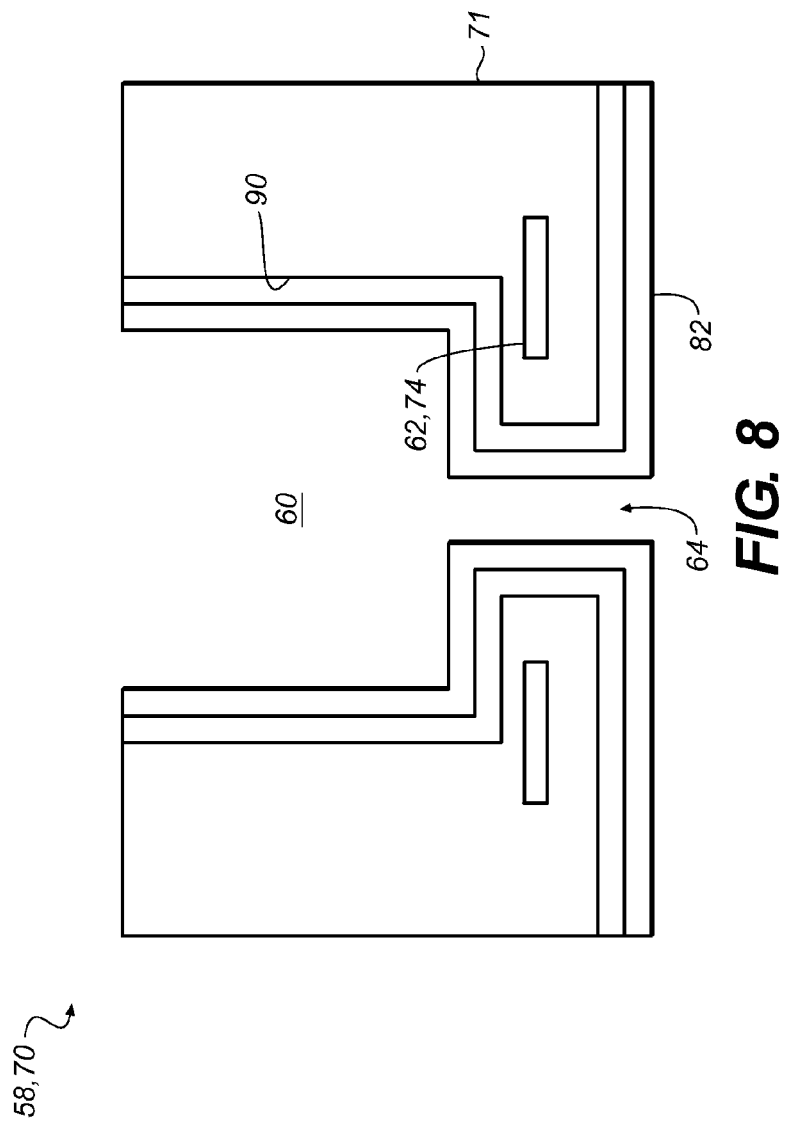

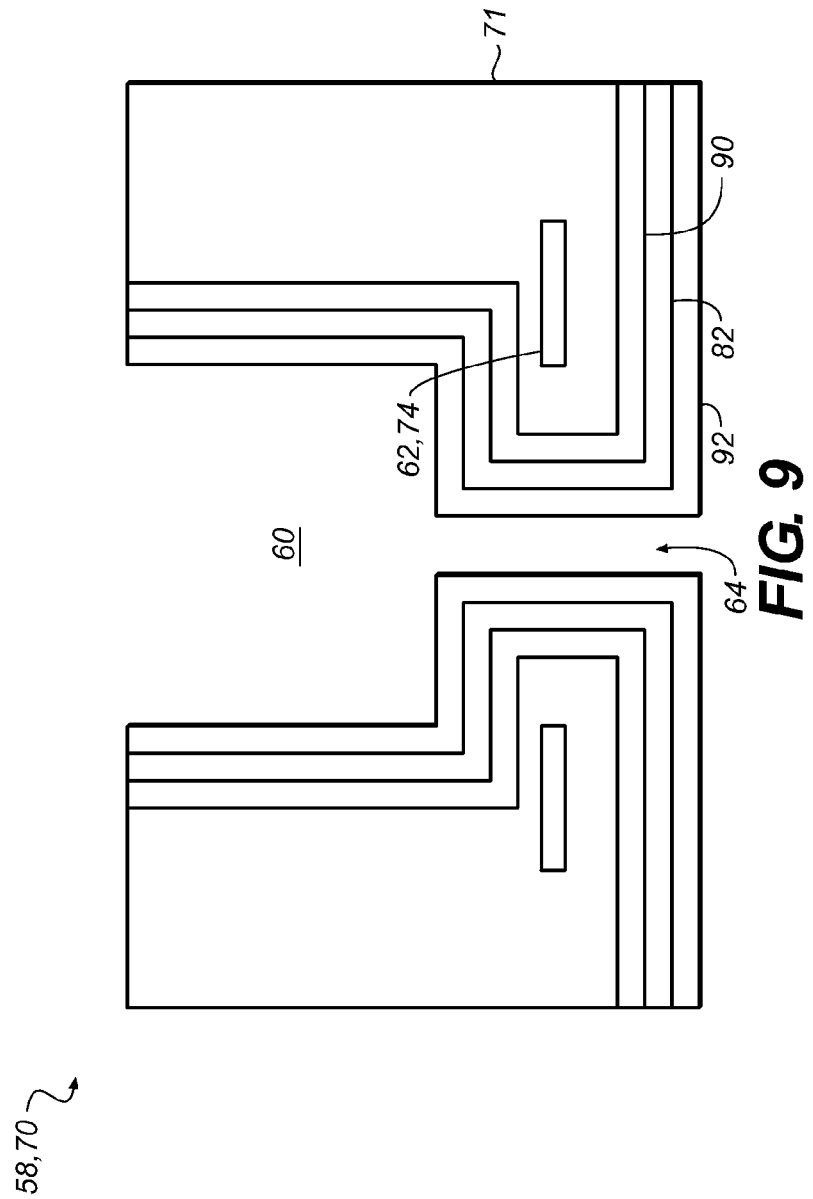

PRINTHEAD FOR INKJET PRINTING DEVICE

CROSS-REFERENCE TO RELATED APPLICATIONS

Reference is made to commonly assigned Ser. No. 13/228,919 filed Sep. 9, 2011, directed towards "Microfluidic Device With Multilayer Coating," the disclosure of which is incorporated by reference herein in its entirety.

FIELD OF THE INVENTION

This invention relates generally to the field of digitally controlled printing devices, and in particular to printheads for digitally controlled inkjet printing devices where chemically resistant thin film layers are applied to the inkjet printhead for the purpose of improving the operation of the printing system.

BACKGROUND OF THE INVENTION

Inkjet printing has become recognized as a prominent contender in the digitally controlled, electronic printing arena. Among the many advantages of inkjet printing is its non-impact, low-noise characteristics, its use of plain paper, and its avoidance of toner transfers and fixing. Inkjet printing mechanisms can be categorized by technology, as either drop on demand inkjet or continuous inkjet. Both drop on demand inkjet and continuous inkjet printing employ a printhead comprised of a material layer and drop forming mechanisms and nozzles that are located in or on the material layer. The drop forming mechanisms, nozzles, and associated ink channels in the printhead are provided in the form of an integrated array of microfluidic devices for printing an array of ink drops.

One type of digitally controlled printing technology, drop-on-demand inkjet printing, typically provides ink droplets for impact upon a recording surface using a pressurization actuator (thermal, piezoelectric, etc.). The actuator is also known as the drop forming mechanism. Selective activation of the actuator or drop forming mechanism causes the formation and ejection of an ink droplet that crosses the space between the printhead and the print media and strikes the print media. The formation of printed images is achieved by controlling the individual formation of ink droplets, as is required to create the desired image. With thermal actuators, a resistive heater, located at a convenient location, heats the ink causing a quantity of ink to phase change into a gaseous steam bubble. This increases the internal ink pressure sufficiently for an ink droplet to be expelled. The bubble then collapses as the heating element cools, and the resulting vacuum draws fluid from a reservoir to replace ink that was ejected from the nozzle. The resistive heaters in thermally actuated drop on demand inkjet printheads operate in an extremely harsh environment. They must heat and cool in rapid succession to enable the formation of drops usually with a water based ink with a superheat limit of approximately 300° C. Under these conditions of cyclic stress, in the presence of hot ink, dissolved oxygen, and possibly other corrosive species, the heaters will increase in resistance and ultimately fail via a combination of oxidation and fatigue, accelerated by mechanisms that corrode the heater or its protective layers (chemical corrosion and cavitation corrosion). It is known to those skilled in the art that the resistive heating element employed in the drop forming mechanism of a thermally actuated drop on demand inkjet printhead can fail because of cavitation processes and thermally activated corrosion processes occurring during operation of the inkjet printhead with the ink, printing fluid, or cleaning fluids employed in the printing system.

To protect against the effects of oxidation, corrosion and cavitation on the heater material in drop on demand printers, inkjet manufacturers use stacked protective layers, typically made from $Si_3N_4$, SiC and Ta. In certain prior art devices, the protective layers are relatively thick. U.S. Pat. No. 6,786,575 granted to Anderson et al (assigned to Lexmark) for example, has 0.7 µm of protective layers for a ~0.1 µm thick heater—that is, 700 nanometers of protective layers for a ~100 nanometer thick heater. U.S. Pat. Pub. 2011/0018938 discloses printing devices having ink flow aperture extending through a substrate, where side walls of the apertures are coated with a coating chosen from one of silicon dioxide, aluminum oxide, hafnium oxide and silicon nitride. The only exemplified coating is a 20,000 Angstrom (2000 nanometers) thick silicon dioxide coating.

A second type of digitally controlled printing technology is the continuous inkjet printer, commonly referred to as "continuous stream" or "continuous" inkjet printer. These printers use a pressurized ink source and a microfluidic drop forming mechanism located proximate to the flow of ink from the pressurized ink source to produce a continuous stream of ink droplets. Some designs of continuous inkjet printers utilize electrostatic charging devices that are placed close to the point where a filament of ink breaks into individual ink droplets. The ink droplets are electrically charged and then directed to an appropriate location by deflection electrodes. When no print is desired, the ink droplets are directed into an ink-capturing mechanism (often referred to as catcher, interceptor, or gutter). When print is desired, the ink droplets are directed to strike a print medium. Alternatively, deflected ink droplets may be allowed to strike the print media, while non-deflected ink droplets are collected in the ink capturing mechanism.

U.S. Pat. No. 1,941,001, issued to Hansell on Dec. 26, 1933, and U.S. Pat. No. 3,373,437 issued to Sweet et al. on Mar. 12, 1968, each disclose an array of continuous inkjet nozzles wherein ink droplets to be printed are formed by a printhead comprised of a material layer and drop forming mechanism and the drops are selectively charged and deflected towards the recording medium. This technique is known as binary deflection continuous ink jet.

Later developments for continuous flow inkjet improved both the method of drop formation, drop forming mechanisms, and methods for drop deflection. For example, U.S. Pat. No. 3,709,432, issued to Robertson on Jan. 9, 1973, discloses a method and apparatus for stimulating a filament of working fluid causing the working fluid to break up into uniformly spaced ink droplets through the use of transducers and a method for controlling the trajectories of the filaments before they break up into droplets.

U.S. Pat. No. 6,079,821, issued to Chwalek et al., on Jun. 27, 2000, discloses a continuous inkjet printer and a printhead with a drop forming mechanism that uses actuation of asymmetric resistive heaters to create and control the trajectory of individual ink droplets from a filament of working fluid. A printhead includes a pressurized ink source and an asymmetric heater operable to form printed ink droplets and non-printed ink droplets. Printed ink droplets flow along a printed ink droplet path ultimately striking a print media, while non-printed ink droplets flow along a non-printed ink droplet path ultimately striking a catcher surface. Non-printed ink droplets are recycled or disposed of through an ink removal channel formed in the catcher.

While the inkjet printer disclosed in Chwalek et al. works extremely well for its intended purpose, using a heater to create and deflect ink droplets increases the energy and power requirements of this device. It is known to those skilled in the art that increased energy and power dissipated in an inkjet printhead increases the possibility of printhead failure caused by thermally activated corrosion and cavitation processes that occur during the operation of the inkjet printhead in contact with the ink, printing fluid, or cleaning fluid.

U.S. Pat. No. 6,588,888, issued to Jeanmaire et al. on Jul. 8, 2003, discloses a continuous inkjet printer capable of forming droplets of different size and having a droplet deflector system for providing a variable droplet deflection for printing and non-printing droplets. The printhead disclosed by Jeanmaire comprises a plurality of nozzles and a drop forming mechanism on each nozzle comprised of an annular heater at least partially formed or positioned on or in a silicon material layer of the substrate of the printhead around corresponding nozzles. Each heater is principally comprised of a resistive heating element that is electrically connected to a controllable power source via conductors. Each nozzle is in fluid communication with an ink supply through an ink passage or liquid chamber also formed in printhead. It is known to those skilled in the art that the thermally actuated resistive heating elements disclosed as part of the drop forming mechanism can become non-functional as a result of thermally activated corrosion processes that occur when the inkjet printhead is operated in contact with the ink, printing fluid, or cleaning fluid employed in the printing system.

It is known, then, that both drop on demand printheads and continuous inkjet printheads are subject to corrosion and wear during use as a result of exposure to inks and other fluids employed in printing systems. The printhead in both drop on demand and continuous inkjet printing apparatus is in continual contact with ink and it has been found that both drop on demand and continuous inkjet printheads are degraded over time by continual contact with ink and other fluids employed in printing apparatus. For example, Beach, Hilderbrandt, and Reed observed as early as 1977 the importance of material selection in inkjet printers as it relates to corrosion and wear resistance. B. L. Beach, C. W. Hilderbrandt, W. H. Reed; IBM Journal of Research and Development, volume 21, January 1977, pp 75-80; "Materials Selection for an Inkjet Printer". As mentioned previously, a common method to address the observed performance degradation of both drop on demand printheads and continuous inkjet printheads is to coat the printhead with a corrosion resistant and/or wear resistant layer or film. Lee, Eldridge, Liclican, and Richardson proposed the use of passivating layers to address corrosion and wear resistance in continuous inkjet printheads and found that amorphous films containing silicon, carbon, and hydrogen were effective for improving corrosion and wear resistance. The amorphous films containing silicon, carbon, and hydrogen are also called amorphous silicon carbide films, amorphous silicon carbide layers, silicon carbide, and SiC; M. H. Lee, J. M. Eldridge, L. Liclican, And R. E. Richardson Jr.; Journal of the Electrochemical Society 129(10), (1982), 2174-2178; "Electrochemical test to evaluate passivation layers: Overcoats of Si in Ink". Gendler and Chang demonstrated the corrosive effects of ink formulations on amorphous silicon carbide layers applied onto inkjet printheads. P. L. Gendler and L. S. Chang, Chem. Mater. 3 (1991)635-641; "Adverse Chemical Effects on the Plasma-Deposited Amorphous Silicon Carbide Passivation Layer of Thermal Ink-Jet Thin-Film Heaters". The chemical stability requirements for an inkjet printhead including the drop forming mechanism are well known to those skilled in the art. The requirements for chemical stability of the printhead include stability of the printhead under complete immersion in ink and any other additional fluid employed in the printing system such as cleaning fluids and image stabilization fluids containing polymers, dispersants, surfactants, salts, solvents, humectants, pigments, dyes, mordants, and the like that are familiar to those skilled in the art. It is known that it is highly desirable for the printhead to have immunity to the effects of both anionic and cationic contamination from diffusion processes that occur upon exposure of the printhead to ink or other fluids employed in the printing system that contain cations and anions. These requirements are applicable to all inkjet printing technologies including drop on demand and continuous inkjet digitally controlled printing technologies.

In U.S. Pat. No. 6,502,925 Anagnostopoulos et al described an inkjet printhead comprised of a material layer and a drop forming mechanism. The material layer is formed of a silicon substrate and includes a nozzle array as well as an integrated circuit formed therein for controlling operation of the print head. The silicon substrate has one or more ink channels, also called ink chambers, formed therein along the longitudinal direction of the nozzle array. The material layer also includes an insulating layer or layers that overlay the silicon substrate and the insulating layer or layers has a series or an array of nozzle openings or bores formed therein along the length of the substrate and each nozzle opening communicates with an ink channel. Each nozzle of the nozzle array is in fluid communication with an ink supply through an ink channel, ink passage, or liquid chamber also formed in printhead. The area comprising the nozzle openings forms a generally planar surface to facilitate maintenance of the printhead. The drop forming mechanism, part of the material layer, is comprised of a resistive heater element, also called a resistive heater, and at least one drop forming mechanism is associated with each nozzle opening or bore for asymmetrically or symmetrically heating ink as ink passes through the nozzle opening or bore. It is known to those skilled in the art that the material layer of the printhead, as well as the drop forming mechanism in or on the material layer, is also susceptible to chemical corrosion processes and that an additional pathway available for printhead failures involves failure of the material layer and any associated electrical circuitry as a result of corrosion of the material layer or any element thereof.

The useful life of an inkjet printhead with its associated material layer and thermal actuators or resistive heaters that are part of the drop forming mechanism is dependent on a number of factors including, but not limited to, dielectric breakdown, corrosion, fatigue, electromigration, contamination, thermal mismatch, electrostatic discharge, material compatibility, delamination, and humidity, to name a few. Accordingly, the incorporation of layers, films or coatings on the material layer of the printhead, drop formation mechanism, and liquid chamber are employed to provide a printhead robust enough to withstand the different types of failure modes described above. Various types of layers, coatings, and films have been investigated for corrosion resistance. U.S. Pat. No. 6,786,575 to Anderson et al, e.g., discloses use of passivation layers comprising silicon carbide and silicon nitride. Combinations of layers, coatings, and films, are also called combination layers, combination coatings, and combination films. Combination layers in layers, films, or coatings are layers, films, or coatings where essentially a layer comprised of one material overlays and is in contact with a second layer of a second material, the second material being of different chemical composition than the first material. Combination layers comprised of only two layers, films or coatings of two different materials are also called bilayers. Combination layers can be called trilayers when three different materials are used and overlay each other, and so on.

Complex coatings may be comprised of multiple combination layers. For example, a complex film, layer or coating may be comprised of multiple bilayers or multiple combination layers, combination films, or combination coatings. Complex coatings comprised of multiple layers of different materials where at least two differentiable, chemically different materials are present are also known as stacks or laminates. Films comprised of two or more layers of different chemically distinguishable materials are also sometimes called laminates, laminate films, laminate layers, laminate coatings, multilayer films, and the like. Laminate films having at least two layers whose thickness is less than 100 nm can be called microlaminates. Microlaminates are also sometimes called nanolaminates.

Combination layers, and specifically complex multilayered films comprised of multiple bilayers have been investigated for corrosion resistance in various applications with mixed results. For example, Matero and coworkers explored the use of combination layers of $Al_2O_3$—$TiO_2$ (also called bilayers of $Al_2O_3$—$TiO_2$) as corrosion resistant coatings on 304 stainless steel as described by R. Matero, M. Ritala, M. Leskalae, T. Salo, J. Aromaa, A. Forsen; J. Phys. IV 9 (1999) Pr8-493 through Pr9-499; "Atomic Layer deposited thin films for corrosion protection". Whereas $Al_2O_3$ and $TiO_2$ alone were found to have unsatisfactory corrosion resistance, $Al_2O_3$—$TiO_2$ bilayer structures showed improved corrosion resistance performance relative to the binary oxide films. The authors specifically remarked, however, that they observed "no clear tendency to improve performance by increasing the number of layers". Almomani and Aita investigated the use of combination layers in the hafnia-alumina system, that is, the $HfO_2$—$Al_2O_3$ system, for improved corrosion resistance of biomedical implants as described by M. A. Almomani and C. R. Aita, in J. Vac. Sci. Technol. A, 27(3)(2009)449-455 "Pitting corrosion protection of stainless steel by sputter deposited hafnia, alumina, and hafnia-alumina nanolaminate films".

Combination layers have also been investigated for functions distinct from providing chemical resistant corrosion protection. U.S. Pat. No. 7,426,067 discloses atomic layer deposition of various layer compositions or combination of layers on micro-mechanical devices to provide, e.g., physical protection from wear and providing electrical insulation. Control of crystallization of zirconium oxide and hafnium oxide in laminate films of zirconium oxide or hafnium oxide with aluminum oxide interlayers to achieve atomically smooth surfaces for capacitor and interlayer dielectric applications has been discussed in the literature. Hausmann and Gordon [D. M Hausmann and R. G. Gordon in Journal of Crystal Growth, 249 (2003) 251-261; "Surface morphology and crystallinity control in the atomic layer deposition (ALD) of hafnium and zirconium oxide thin films"], e.g., reported that the minimum number of aluminum oxide layers needed to retard crystal growth between two thicker layers of hafnium or zirconium oxide was approximately 5 layers of aluminum oxide (0.5 nm aluminum oxide) between approximately 100 layers of zirconium or hafnium oxide (10 nm zirconium or hafnium oxide). Control of crystallization of hafnium oxide in laminate films of hafnium oxide with tantalum oxide interlayers to achieve smooth surfaces for capacitor applications has been discussed in the literature. Kukli, Ihanus, Ritala, and Leskela [K. Kulki, J Ihanus, M. Ritala, M. Leskela, Appl. Phys. Lett. 68(26) 24 Jun. 1996 p 3737] reported that $HfO_2$ crystallization is observed when the thickness of the $HfO_2$ layer in $HfO_2$—$Ta_2O_5$ nanolaminates is greater than 10 nm.

It is desirable that inkjet printheads used for continuous inkjet printing should operate without failure for extended time periods. One type of failure described above that can require printhead replacement is related to corrosion, chemical dissolution, and optionally cavitation induced failure of thermally actuate resistive heating elements in the printhead drop forming mechanism. It is also known that other heated and unheated surfaces of the printhead such as those located anywhere on the material layer of the printhead including surfaces of integrated circuits incorporated on the printhead material layer that have the possibility of exposure to ink or other fluids used in a printing system can corrode upon exposure to the inks and fluids employed in a digitally controlled printing system. Corrosion of surfaces on or proximate to the material layer can result in the printhead becoming non-functional. It is understood by those skilled in the art that a more chemically resistant and thermally stable inkjet printhead is highly desirable and can provide substantial benefits for ease of use, equipment maintenance, and overall versatility of a printing apparatus. Thus, there is a need for improved inkjet printheads for digitally control inkjet printing apparatus that are chemically resistant and thermally stable.

SUMMARY OF THE INVENTION

It is therefore an objective of the present invention to provide an inkjet printhead for a digitally controlled inkjet printing apparatus wherein the inkjet printhead is comprised of a material layer and a drop formation mechanism positioned in or on the material layer, that is substantially improved in chemical resistance and thermally stability. The objective of the present invention is achieved by providing a chemically resistant and thermally stable multilayer coating onto and in contact with the inkjet printhead wherein the multilayer coating comprises one or more thin film layers comprised primarily of hafnium oxide or zirconium oxide and one or more thin film layers comprised primarily of tantalum oxide, the multilayer coating being located on the material layer. In one embodiment, the multilayer coating may include multiple alternating thin film layers consisting essentially of hafnium oxide and consisting essentially of tantalum oxide, being located on the material layers and drop forming mechanism of the inkjet printhead. In another embodiment of the invention, the multilayer coating may include multiple alternating thin film layers consisting essentially of zirconium oxide and consisting essentially of tantalum oxide, being located on the material layers and drop forming mechanism of the inkjet printhead. Preferably, the inkjet printing apparatus is a continuous stream inkjet printer and the printhead a continuous inkjet printhead.

The corrosion resistant film employed in the invention is particularly beneficial because it can be formed on the printhead using film forming methods that produce conformal films that cover complex geometries, thereby enabling the corrosion resistant film to be formed on all surfaces of the printhead that come in contact with inks or other fluids employed in the printing system.

An additional aspect of the invention is the use of an abrasion resistant layer, such as a layer containing silicon, nitrogen, carbon and oxygen, to provide a mechanically protective film in combination with the chemically resistant films employed in the present invention. Such abrasion resistant layer may be provided overlaying and in contact with all areas or alternatively only selected portions of the chemically resistant film, or alternatively may be provided below all areas or selected portions of the chemically resistant film.

BRIEF DESCRIPTION OF THE DRAWINGS

In the detailed description of the preferred embodiments of the invention presented below, reference is made to the accompanying drawings, which are not necessarily to scale, in which:

FIGS. 3a and 3b are cross-sectional side views of the nozzle and drop forming mechanism in some different types of inkjet printheads, where FIG. 3a shows a schematic cross section of a drop on demand thermal inkjet nozzle of the thermal roof-shooter type and FIG. 3b shows a schematic cross section of a drop on demand thermal inkjet nozzle of the thermal back-shooter type;

FIG. 6 is a cross-sectional side view of a nozzle and drop forming mechanism in a continuous inkjet printhead that has been coated with the multilayer corrosion resistant film in an embodiment of the present invention;

FIG. 7 is a cross-sectional view of a multilayer corrosion resistant film employed in an embodiment of the present invention on a printhead where alternating layers in the corrosion resistant film are of zirconium oxide and tantalum oxide;

FIG. 8 is a cross-sectional side view of a nozzle and drop forming mechanism in a continuous inkjet printhead with an adhesion promoting layer that has been coated with the multilayer corrosion resistant film in an embodiment of the present invention;

FIG. 9 is a cross-sectional side view of a nozzle and drop forming mechanism in a continuous inkjet printhead with an adhesion promoting layer that has been coated with the multilayer corrosion resistant film of the present invention and an abrasion resistant film.

DETAILED DESCRIPTION OF THE INVENTION

The present description will be directed in particular to elements forming part of, or cooperating more directly with, apparatus and compositions in accordance with the present invention. It is to be understood that elements not specifically shown or described may take various forms well known to those skilled in the art.

Figure 1:
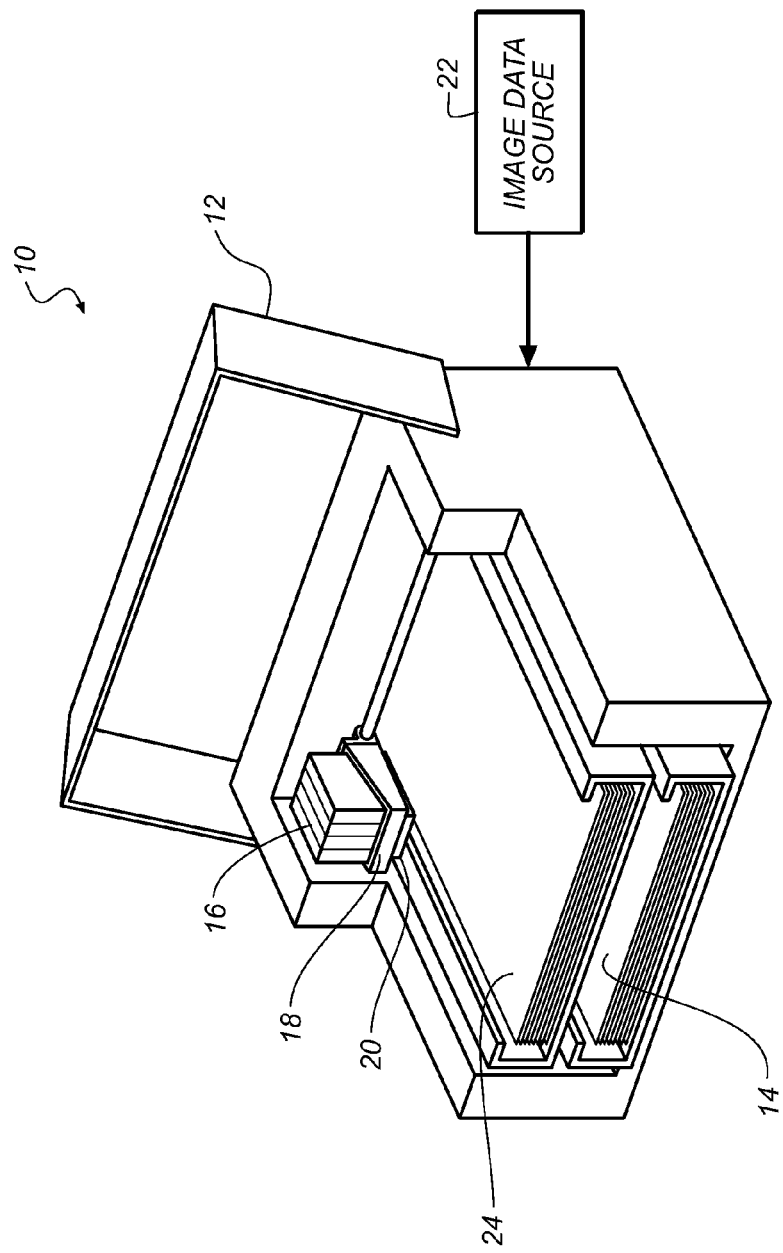
FIG. 1 is a schematic view of a drop on demand inkjet printer system employing a drop on demand printhead.

Drop-on-demand (DOD) liquid emission devices have been known as ink printing devices in digitally controlled ink jet printing systems for many years. Early devices were based on piezoelectric actuators such as are disclosed in U.S. Pat. Nos. 3,946,398 and 3,747,120. A currently popular form of ink jet printing, thermal ink jet (or "thermal bubble jet"), uses electrically resistive heaters to generate vapor bubbles which cause drop emission, as is discussed in U.S. Pat. No. 4,296,421. FIG. 1 shows one schematic example of a drop on demand inkjet printing system 10 that includes a protective cover 12 for the internal components of the printer. The printer contains a recording media supply 14 in a tray. The printer includes one or more ink tanks 16 (shown here as having four inks) that supply ink to a printhead 18. The printhead 18 and ink tanks 16 are mounted on a carriage 20. The printer includes a source of image data 22 that provides signals that are interpreted by a controller (not shown) as being commands to eject drops of ink from the printhead 18. Printheads may be integral with the ink tanks or separate. Exemplary printheads are described in U.S. Pat. No. 7,350,902. In a typical printing operation a media sheet travels from the recording media supply 14 in a media supply tray to a region where the printhead 18 deposits droplets of ink onto the media sheet. The printed media 24 is accumulated in an output tray. The general description of the drop on demand inkjet printer system of FIG. 1 is also suited for use as part of a general description of a drop on demand type digitally controlled inkjet printer apparatus of the invention.

In another digitally controlled inkjet printing process, known as continuous inkjet, a continuous stream of droplets is generated, a portion of which are directed in an image-wise manner onto the surface of the image-recording element, while un-imaged droplets are caught and returned to an ink sump or ink reservoir. Continuous inkjet printers are disclosed in U.S. Pat. Nos. 6,588,888; 6,554,410; 6,682,182; 6,793,328; 6,866,370; 6,575,566; and 6,517,197. Anagnostopolous et al described a CMOS/MEMS integrated inkjet print head and method of forming same in U.S. Pat. No. 6,943,037 dated Sep. 13, 2005. All references in U.S. Pat. No. 6,943,037 are hereby incorporated by reference herein.

Figure 2:
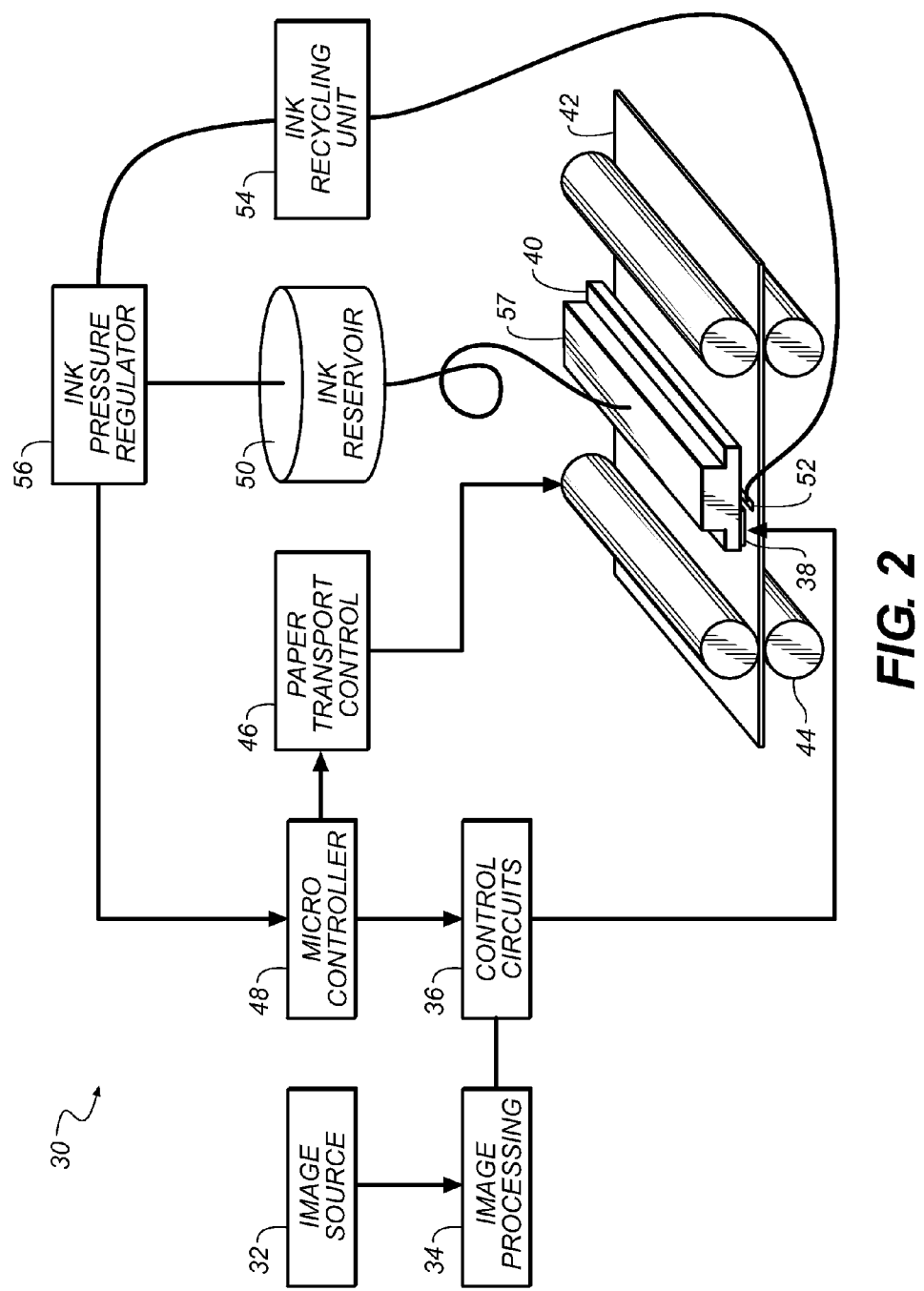
FIG. 2 is a schematic view of a continuous inkjet printer system employing a continuous inkjet printhead.

Referring to FIG. 2, a continuous printing system 30 includes an image source 32 such as a scanner or computer which provides raster image data, outline image data in the form of a page description language, or other forms of digital image data. This image data is converted to half-toned bitmap image data by an image processing unit 34 which also stores the image data in memory. A plurality of drop forming mechanism control circuits 36 read data from the image memory and apply time-varying electrical pulses to a drop forming mechanism(s) 38 that are associated with one or more nozzles of a printhead 40. These pulses are applied at an appropriate time, and to the drop forming mechanism of the appropriate nozzle, so that drops formed from a continuous ink jet stream will form spots on a recording medium 42 in the appropriate position designated by the data in the image memory.

Recording medium 42 is moved relative to printhead 40 by a recording medium transport system 44, which is electronically controlled by a recording medium transport control system 46, and which in turn is controlled by a micro-controller 48. The recording medium transport system shown in FIG. 2 is a schematic only, and many different mechanical configurations are possible. For example, a transfer roller could be used as recording medium transport system 44 to facilitate transfer of the ink drops to recording medium 42. Such transfer roller technology is well known in the art. In the case of page width printheads, it is most convenient to move recording medium 42 past a stationary printhead. However, in the case of scanning print systems, it is usually most convenient to move the printhead along one axis (the sub-scanning direction) and the recording medium along an orthogonal axis (the main scanning direction) in a relative raster motion.

Ink is contained in an ink reservoir 50 under pressure. In the non-printing state, continuous ink jet drop streams are unable to reach recording medium 42 due to an ink catcher 52 that blocks the stream and which may allow a portion of the ink to be recycled by an ink recycling unit 54. The ink recycling unit reconditions the ink and feeds it back to reservoir 50. Such ink recycling units are well known in the art. The ink pressure suitable for optimal operation will depend on a number of factors, including geometry and thermal properties of the nozzles and thermal properties of the ink. A constant ink pressure can be achieved by applying pressure to ink reservoir 50 under the control of ink pressure regulator 56. Alternatively, the ink reservoir can be left unpressurized, or even under a reduced pressure (vacuum), and a pump is employed to deliver ink from the ink reservoir under pressure to the printhead 40. In such an embodiment, the ink pressure regulator 56 can comprise an ink pump control system.

The ink is distributed to printhead 40 through an ink channel 57. The ink preferably flows through slots or holes etched through a material layer (e.g., a silicon substrate) of printhead 40 to its front surface, where a plurality of nozzles and drop forming mechanisms, for example, heaters, are situated. When printhead 40 is fabricated from silicon, drop forming mechanism control circuits 36 can be integrated with the printhead. Printhead 40 also includes a deflection mechanism (not shown in FIG. 2) which causes the trajectories of drops selected for printing (print drops) and the trajectories of drops selected not to print to diverge (non-print drops). The catcher 52, also commonly called a gutter, is positioned to intercept the trajectory of the non-print drops while not intercepting the trajectories of the print drops.

The printhead employed in a digitally controlled inkjet printing apparatus is comprised of at least a material layer and a drop forming mechanism. In a preferred embodiment of this invention the material layer may contain within a semiconductor material (silicon, etc.) and may contain integrated circuits, also called integrated drivers, that may be formed using known semiconductor fabrication techniques such as CMOS circuit fabrication techniques and micro-electro mechanical structure (MEMS) fabrication techniques. However, it is specifically contemplated and therefore within the scope of this disclosure that the material layers of the printhead employed in a digitally controlled inkjet printing apparatus may be formed from any materials using any fabrication techniques conventionally known in the art of both drop on demand and continuous inkjet printing. Thus the material layer may be comprised of multiple materials or combinations of materials both organic and inorganic, including silicon; metals such as stainless steel or nickel; polymers; ceramics such as aluminum oxide or other oxides such as those used in the construction of printheads containing piezoelectric elements prepared from for example, lead zirconate titanates and the like; quartz, vitreous quartz or other glasses; or any other material known in the art which is suitable for use as a material layer in printheads in a digitally controlled inkjet printing apparatus.

While the material layer may be comprised of such various possible materials, in a specific embodiment the invention is particularly useful wherein the material layer is a silicon-based material, where silicon is the primary material of construction, and wherein the printhead is manufactured by silicon-based CMOS-MEMS printhead fabrication techniques and the printhead incorporates fluid channels running through the silicon, such as taught in above referenced U.S. Pat. Nos. 6,588,888 and 6,943,037, given that silicon-fluid interactions are particularly relevant to such devices.

The drop forming mechanism of the inkjet printhead may be positioned in or on the material layer of the printhead. The drop forming mechanism may be positioned about or near at least one nozzle, also referred to as a nozzle opening or bore. The drop forming mechanism may be, therefore, proximate to at least one or more nozzles. A material layer wherein at least one nozzle is located therein or thereupon is called a nozzle plate. An array of nozzles can also be located on or in the material layer and a nozzle plate may comprise a material layer with a plurality of nozzles that are positioned in or on the material layer. A plurality of nozzles arranged in an array in or on a material layer is also called a nozzle plate. It is well understood in the art of inkjet printing that arrays of nozzles on a nozzle plate are advantageous for printing in an imagewise manner onto the surface of the image-recording element. Each nozzle in or on the material layer or nozzle plate may be proximate to a drop forming mechanism and each nozzle is in fluid communication with an ink supply through means of a liquid chamber. There may be one or more liquid chambers proximate to the nozzle plate providing fluid communication with an ink supply or ink reservoir. The liquid chamber functions to transfer ink or other system fluids to the nozzle. The liquid chamber is also called a fluid chamber, an ink channel, an ink passage, a fluid passage, a backside channel, or backside ink channel. The liquid chamber or fluid chamber containing ink may also be on or in the material layer of the printhead and thereby be incorporated into the printing system in a compact manner. A nozzle plate may have one or more liquid chambers on or in the material layer of the printhead. Often the nozzle plate that is in or on the material layer and may be a part of the material layer of the printhead is comprised of one or more layers fabricated from various materials including fabricated metal foils or electroplated metals, ceramics, polymers, or electrically insulating single or multiple layers that overlie and are in contact with the material layers of the printhead. The nozzle plate may be electrically conductive, electrically insulating, thermally conductive or thermally insulating. It is specifically contemplated and therefore within the scope of this disclosure that the nozzle plate and material layers of printhead employed in a digitally controlled inkjet printing apparatus may be formed from any materials using any fabrication techniques conventionally known in the art of both drop on demand and continuous inkjet printing.

A number of different nozzle arrangements are used with various types of printers described above. FIGS. 3*a* and 3*b* show some representative nozzle architectures for drop-on-demand and continuous inkjet printheads.

FIG. 3*a* shows, in cross-sectional side view, the basic arrangement of a drop ejector 58 for one type of drop-on-demand inkjet printer, commonly termed a "roof-shooter device," and disclosed, for example, in U.S. Pat. No. 6,582,060 issued to Kitakami, et al. on Jun. 24, 2003. The drop ejector includes a fluid chamber 60 which receives ink from ink tanks 16 (FIG. 1) through flow channels which are not shown. A drop forming device 62, such as a heater which rapidly heats the adjacent ink to form a vapor bubble, ejects ink from a nozzle 64 of fluid chamber 60. Nozzle 64 may have a diameter and length each of less than 100 micrometers (typically diameter of about 10-15 micrometers and nozzle bore length of about 5 micrometers), and chamber 60 and associated flow channels may have characteristic length, width or depth dimensions of less than 500 micrometers. The drop forming device is formed on material layer 69 which forms the fluid chamber wall 66 opposite the nozzle 64. Typically, the wall 66 and the drop forming device 62 are formed using semiconductor based fabrication processes, facilitating electronic coupling of the drop forming device with control electronics. The other walls 68 of the fluid chamber 60, including the nozzle face wall may also be formed using semiconductor processes or alternatively may be formed from a polymeric material.

FIG. 3*b* shows a cross-sectional side view of drop ejector 58 in another type of drop-on-demand printer, commonly termed a "back-shooter device" type, and disclosed, for example, in U.S. Pat. No. 6,561,626, issued to Min et al. on May 13, 2003. In this design, the drop forming mechanism 62 is a thermal bubble jet heater 74 fabricated in the material layer 71 that forms the wall 68 that includes the nozzle 64 and the heater 74 surrounding the associated nozzle 64. The vapor bubble expands in the fluid chamber 60 in a direction opposite the direction of the drop ejected from the nozzle. With this arrangement, material layer 71 is bonded to a body 72, which includes a channel 57, to form the enclosing structure for fluid chamber 60. Nozzle 64 may have a diameter and length of less than 100 micrometers (typically diameter of about 10-15 micrometers and nozzle bore length of about 5 micrometers, as noted above), and chamber 60 and flow channel 57 may have characteristic length, width or depth dimensions of less than 500 micrometers.

The drop ejectors 58 used to form drops that are shown in FIGS. 3a and 3b can also be employed in printheads 30 (FIG. 2) in continuous inkjet applications where the fluid chamber 60 is supplied with pressurized ink from a reservoir 50 (FIG. 2) to produce a continuous flow or continuous stream of ink through the nozzle and appropriate adjustments are made for how power is dissipated in the thermal actuator elements. In FIGS. 3a and 3b the nozzle plate and nozzles are part of the material layer and the drop formation mechanism is also in the material layer.

Figure 4:
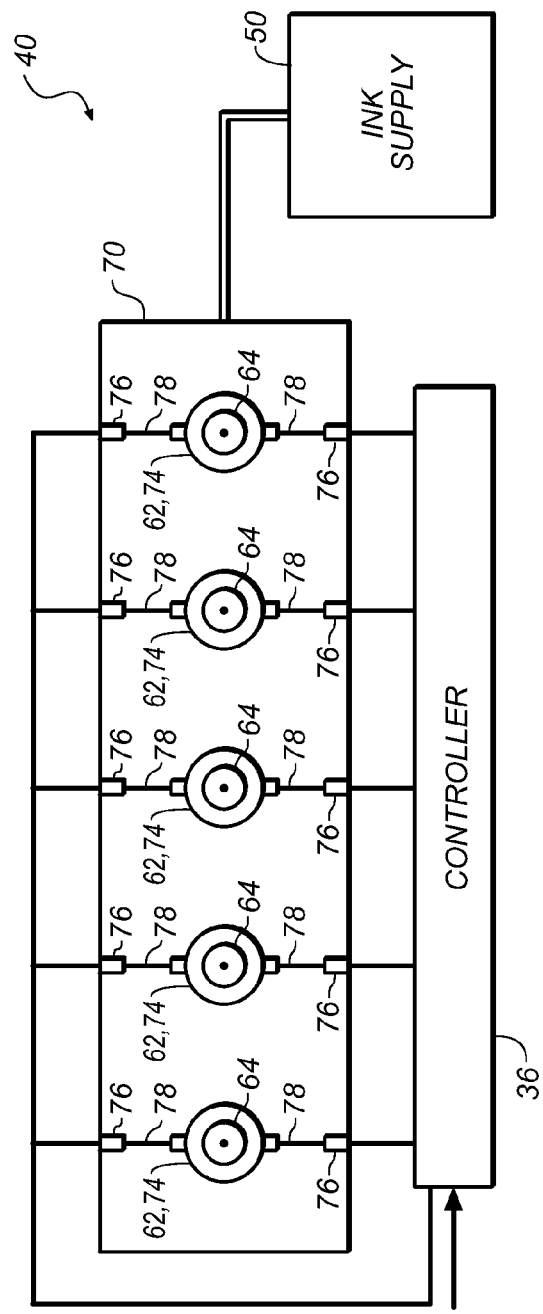
FIG. 4 is a schematic plan view of a continuous inkjet printhead of the type employed with an embodiment of the present invention.

FIG. 4 shows a schematic plan view of a portion of an inkjet printhead 40 that has drop ejectors like drop ejectors 58 shown in FIG. 3b. The figure includes a representative architecture for a drop forming mechanism, a thermally actuated drop forming element, and a nozzle array in a nozzle plate located in or on the material layer of a continuous inkjet printhead from a digitally controlled continuous inkjet printing apparatus. Referring to FIG. 4, the printhead 40 comprises a plurality of nozzles 64 formed in a nozzle plate 70. Thermal actuated drop forming devices 62 in the form of annular heaters 74 are at least partially formed or positioned on the nozzle plate 70 comprising part of the material layer 71 (FIG. 3b) of the printhead 40 around and proximate to corresponding nozzles 64. Although each heater 74 may be disposed radially away from an edge of a corresponding nozzle 64, the heaters 74 are preferably disposed close to corresponding nozzles 64 in a concentric manner. In a preferred embodiment, heaters 74 are formed in a substantially circular or ring shape. However, it is specifically contemplated that heaters 74 may be formed in a partial ring, square, or other shape adjacent to the nozzles 64. Each heater 74 in a preferred embodiment is principally comprised of a resistive heating element electrically connected to contact pads 76 via conductors 78. Each nozzle 64 is in fluid communication with ink supply 50 through an ink passage, also called a fluid chamber (not shown) also formed in or on the material layer of printhead 40. It is specifically contemplated that printhead 40 may incorporate additional ink supplies in the same manner as supply 50 as well as additional corresponding nozzles 64 in order to provide color printing using three or more ink colors. Additionally, black and white or single color printing may be accomplished using a single ink supply 50 and nozzle 64.

Conductors 78 and electrical contact pads 76 may be at least partially formed or positioned on the printhead 40 and provide an electrical connection between a mechanism control circuit 36 and the heaters 74. Alternatively, the electrical connection between the mechanism control circuit 36 and heater 74 may be accomplished in any well known manner. Mechanism control circuit 36 may be a relatively simple device (a switchable power supply for heater 74, etc.) or a relatively complex device (a logic controller or programmable microprocessor in combination with a power supply) operable to control many other components of the printer in a desired manner.

Further explanation of the architecture of a continuous inkjet printhead and its operation in a digitally controlled inkjet printing apparatus employing said continuous inkjet printhead are given in, for example U.S. Pat. Nos. 6,588,888 and 6,588,889 issued to Jeanmaire et al., U.S. Pat. No. 6,502,925 Anagnostopoulos et al, and references cited therein which are hereby incorporated into this disclosure.

The thermally actuated drop forming mechanisms described in FIGS. 3a, 3b, and 4 rely on an ability to heat the fluid in order to initiate a drop forming process as the fluid expels through a nozzle. Thermally actuated devices are employed in many other micro-fluidic applications such as pumps, heating elements for bimetallic actuator valves, elements for temperature stabilization in miniaturized chemical measurement systems as well as elements of miniaturized spray ionization. The life of the thermal actuators or resistive heaters that are part of microfluidic devices or additionally drop forming mechanisms is dependent on a number of factors including, but not limited to, dielectric breakdown, corrosion, fatigue, electromigration, contamination, thermal mismatch, electrostatic discharge, material compatibility, delamination, and humidity, to name a few. A resistive heater, also called a heater resistor, such as is used in a microfluidic device and in particular in a microfluidic drop forming device, for example, an inkjet printhead, may be exposed to all of these failure mechanisms. Accordingly, exotic resistor films and multiple protective layers, films or coatings are employed to provide a heater stack that is used to provide heater resistors robust enough to withstand the different types of failure modes described above. However, the overall thickness of the heater stack should be minimized because the input energy required for effective drop formation from the drop forming mechanism is a linear function of heater stack thickness. In order to provide competitive actuator devices from a power dissipation and production throughput perspective, the heater stack should not be arbitrarily thickened to mitigate failures such as, for example failures that occur due to the cavitation effects, step coverage issues, delamination problems, electrostatic discharge, etc. In other words, improved thermal actuator, resistive heater, or heater resistor lifetimes through the use of over-design of the thin film resistive and protective layers may produce a noncompetitive or even non-functional product.

Coatings, films, or thin layers that are used for the purpose of improving the reliability of thermal actuators in microfluidic devices should provide acceptable heat transfer and exhibit acceptable thermal stability. One of the well known factors determining the suitability of coatings, films, or thin layers for improving the reliability for thermal actuators employed in microfluidics devices is related to the number of sites for fluid penetration in the coating, film, or thin layers. Almomani et al. (M. A. Almomani and C. R. Aita, J. Vac. Sci. Technol. A, 27(3)(2009)449-455 "Pitting corrosion protection of stainless steel by sputter deposited hafnia, alumina, and hafnia-alumina nanolaminate films") have commented that previous studies in the literature "conclude that a chief reason why even a thick single layer film can fail to protect is because intrinsic mesoscopic growth structures known as 'pinholes' provide fast transport channels for electrolyte through the film to the underlying substrate surface. Pinholes are formed during film growth when three-dimensional islands formed during the initial nucleation stages of film growth coalesce and begin to contact each other to form more continuous film. Pinholes are present in both crystalline and amorphous films." The pinhole density is influenced by factors that influence the film structure itself. Phase transitions, such as thermally induced crystallization that produce volume changes in the film structure during either crystal growth or during the transition from an amorphous or poorly ordered film to a crystalline and highly ordered film, can increase the pinhole density of the film thereby influencing the susceptibility of the films towards fluid penetration. Thus the thermally stability of the thin film used to improve the reliability of thermal actuators in microfluidic devices and, in particular, ink jet printheads is important. One important measure of thermal stability of a film is the temperature at which the amorphous, poorly ordered, or poorly crystalline films begin to crystallize. This temperature is called the crystallization temperature or temperature of crystallization. At the crystallization temperature, there is sufficient mobility of species within the film to allow atomic rearrangements that can produce changes in the number and size of mesoscopic defects or pinholes present in the films. In many cases, the number and size of mesoscopic defects in the film increases during film crystallization thereby degrading the chemical resistant properties of the film. Thus it is desirable that the temperature of crystallization for amorphous or poorly crystalline thin protective films should at least be higher than the peak operating temperature of the thermal actuator. In the case of inkjet printheads, the temperature of crystallization should at least be higher than the peak operating temperature of any thermal actuator that is a part of the drop forming mechanism. It is additionally preferable that the crystallization temperature of the thin film is high enough so that the film does not crystallize during any subsequent processing steps employed during device fabrication such as the deposition of abrasion or wear resistant overlayers. From a practical perspective of the temperatures normally encountered during processing of semiconductor devices, it is preferred that the thin film does not show crystallization below 350° C. and films, layers, or coatings including films comprised of single or multiple layers that do not crystallize below 350° C. can be considered thermally stable.

To address the problems associated with corrosion and dielectric breakdown of printheads and their associated drop formation mechanisms it has been discovered that films, coatings, and layers possessing exceptional chemical corrosion resistance and dielectric stability can be prepared from hafnium oxide (commonly referred to as hafnia, hafnium dioxide, or $HfO_2$) or zirconium oxide (commonly referred to as zirconia, zirconium dioxide, or $ZrO_2$), and tantalum oxide (commonly referred to as tantala, tantalum pentoxide, or $Ta_2O_5$), where the layers are individually each comprised primarily of hafnium oxide or zirconium oxide and tantalum oxide, and are preferably arranged in specific thicknesses and sequence within the overall coating incorporated in the printhead in addition to the material layer and drop forming mechanism of the printhead. Hafnium oxide, zirconium oxide and tantalum oxide are the oxides of the refractory metals hafnium, zirconium and tantalum, respectively, and these refractory oxides possess a number of desirable properties including chemically stability, low solubility, and exceptional corrosion resistance. The terms "hafnium oxide layer", "zirconium oxide layer", and "tantalum oxide layer" and the like are employed herein for convenience to refer to layers comprised primarily of such indicated material. Such layers may further comprise other materials in compatible minor amounts, and chemical substitutions of hafnium, zirconium and tantalum with minor amounts of isovalent cations in the laminate structure is specifically contemplated. Cation substitution with appropriate charge compensation as is well known in the art of material design may be used, e.g., to tailor the properties of the laminate structures to provide desired physical properties with respect to corrosion resistant or other desired properties such as heat transfer or dielectric constant. In particular, niobium or combinations of cations whose charges and ionic size properly compensate for the pentavalent tantalum cation may be substituted into the laminate structure. Similarly, other tetravalent cations such as tin may be incorporated into the laminate structures to additionally provide a means for tuning and tailoring the properties of the laminate to provide the desired physical properties of the film.

In a particular embodiment, the invention employs a multilayer coating comprised of thin film layers consisting essentially of hafnium oxide or zirconium oxide and consisting essentially of tantalum oxide, where the layers of hafnium oxide or zirconium oxide and of tantalum oxide are arranged in specific thicknesses and sequence have a total thickness which is the sum of the thickness of all the layers of hafnium oxide or zirconium oxide and tantalum oxide of less than 100 nm, more preferably less than 50 nm. As previously mentioned, the input energy required for effective drop formation from the drop forming mechanism is a linear function of total film, coating, or layer thickness in interposed between the drop formation mechanism and the ink or fluid from which drops are to be formed and measurements of drop formation efficiency have shown that the films of the present invention provide excellent corrosion resistance without any measurable influence on drop formation efficiency.

Complex films, coatings, and layers comprised of alternating layers of different materials, for example like hafnium oxide and tantalum oxide, are known by various names including laminates, micro-laminates or microlaminates, nano-laminates or nanolaminates, stacks, stacked structures, alternating layer structures or alternating layer films, stacked laminates, laminate coatings, micro-laminate films, etc. Zirconium, like hafnium is a higher atomic weight member of element group IVb, while tantalum is a member of element group Vb. Thus, multilayer coatings as employed in the invention form complex laminates comprised of multiple layers of oxides selected from higher atomic weight members of distinct groups of the Period Table (i.e., group IVb and group Vb elements). When used in combination of two distinct thin film layers in accordance with the invention, such laminate materials provide further beneficial performance in comparison to use of a single metal oxide layer at an equivalent total layer thickness.

Alternating layers of hafnium oxide (or zirconium oxide) and tantalum oxide dielectrics can be prepared by any method known to those skilled in the art of film deposition. Such methods include physical vapor deposition methods such as evaporation, electron beam evaporation, ion beam evaporation, arc melting evaporation, sputter deposition using both AC and DC voltages employing both flat and cylindrical magnetron sources with appropriate targets and gases for producing oxide films, chemical vapor deposition methods using appropriate volatile precursors for hafnium and tantalum, molecular beam epitaxy, atomic layer deposition, atomic layer epitaxy. It is specifically contemplated and therefore within the scope of this disclosure that the preparation of films comprised of at least one layer of hafnium oxide and one layer of tantalum oxide in contact with one another may be formed from any suitable starting materials using any fabrication or deposition technique known in the art of film deposition. A preferred method for preparation of corrosion resistant dielectric laminate films is atomic layer deposition, especially when the corrosion resistant film must be applied over complex geometries. Complex geometries include those geometries with re-entrant features as well as other features that may not be directly visible to line-of-sight fluxes of vapor species emitting from vapor sources used in film deposition processes and coating processes.

Figure 5:
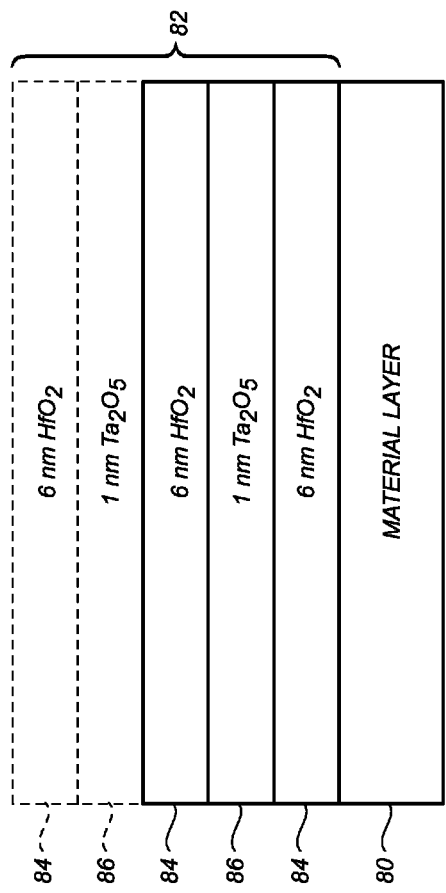
FIG. 5 is a cross-sectional view of a multilayer corrosion resistant film employed in an embodiment of the present invention on a printhead where alternating layers in the corrosion resistant film are of hafnium oxide and tantalum oxide.

In a preferred embodiment, shown in FIG. 5, a material layer 80 is coated and protected by a corrosion resistant film 82 which comprises at least one layer consisting essentially of hafnium oxide 84 and one layer consisting essentially of tantalum oxide 86, where the layer of hafnium oxide and the layer of tantalum oxide overlay and are in contact with each other. In the illustrated embodiment, the corrosion resistant film is a stable dielectric film comprised of multiple alternating layers of hafnium oxide 84 and tantalum oxide 86 that contact each other, where the total number of layers of hafnium oxide, n, is at least 3, and the total number of layers of tantalum oxide is n−1. The thickness of each hafnium oxide layer is preferably at least 2 nm and less than 10 nm. The ratio of the thickness of any hafnium oxide layer to at least one tantalum oxide layer is preferably greater than 2 (i.e., hafnium oxide rich laminates are preferred) and less than 100 (to avoid excessively thick laminates while still providing adequate tantalum oxide layer thickness), the total thickness of the multilayer laminate coating is preferably greater than 10 nm, and each layer of hafnium oxide is in contact with at least one layer of tantalum oxide. A novel feature of the present invention is the use of a corrosion resistant layer having a low coating thickness (e.g., of less than 100 nm, preferably less than 50 nm) which is sufficient to provide protection of the heater elements while still providing excellent performance of the drop forming mechanisms.

FIG. 6 illustrates a cross-sectional view of one embodiment of the present invention. FIG. 6 shows an inkjet printhead nozzle plate 70 comprised of a material layer 71 and a resistive heater 74 drop forming mechanism located on or in the material layer. The material layer 71 is coated with a chemically resistant layer or film 82, where the chemically resistant layer is comprised of at least one thin film layer comprised primarily of hafnium oxide or zirconium oxide in contact with at least one thin film layer comprised primarily of tantalum oxide. The material layer 71 forms part of a wall of a liquid chamber 60, including a nozzle 64. Nozzle 64 has a diameter of about 10 micrometers and nozzle bore length of about 5 micrometers, and chamber 60 has a length (depth) of about 350 micrometers and an elliptical cross section with a main axis of about 120 micrometers and a minor axis of about 30 micrometers, thus forming microfluidic fluid transport features in the material layer 71, wherein the surfaces of such fluid transport features are coated with chemically resistant layer 82. In a preferred embodiment, the chemically resistant layer 82 overlies the resistive heater thermal actuator 74. In a preferred embodiment, the chemically resistant protective layer 82 is comprised of multiple alternating layers consisting essentially of hafnium oxide or zirconium oxide and consisting essentially of tantalum oxide, where the thickness of at least one hafnium oxide or zirconium oxide layer is greater than the thickness of the tantalum oxide layer, thereby forming a complex laminate comprised of multiple layers of oxides of refractory metals selected from higher atomic weight members of distinct groups of the Period Table (i.e., group IVb and group Vb elements).

FIG. 7 shows another embodiment of a corrosion resistant film 82. This corrosion resistant film is comprised of a laminate of alternating layers of at least one layer 88 consisting essentially of zirconium oxide, $ZrO_2$ and at least one layer 86 consisting essentially of $Ta_2O_5$. In a more preferred embodiment, a corrosion resistant, stable dielectric film 82 comprises multiple alternating layers of zirconium oxide 88 and tantalum oxide 86 that contact each other. The thickness of each zirconium oxide layer 88 is preferably at least 2 nm and less than 10 nm. The ratio of the thickness of any zirconium layer to at least one tantalum oxide layer is preferably greater than 2 (i.e., zirconium oxide rich laminates are preferred) and less than 100 (to avoid excessively thick laminates while still providing adequate tantalum oxide layer thickness). In a more preferred embodiment, the total number of layers of zirconium, n, is at least 3, the total number of layers of tantalum oxide is n−1, the total thickness of the multilayer laminate coating is preferably greater than 10 nm, and each layer of zirconium oxide being in contact with at least one layer of tantalum oxide. A novel feature of the present invention is the use of a corrosion resistant layer having a low coating thickness (e.g., of less than 100 nm, preferably less than 50 nm) which is sufficient to provide protection of the heater elements while still providing excellent performance of the drop forming mechanisms, thermal actuators, and resistive heaters.

While not wishing to be tied to a particular understanding of the physics and material science involved, it is thought that fluid transport through material layers can occur at defects such as grain boundaries. Grain boundary or other mesoscopic defects become prevalent in layers that crystallize, and the refractory oxides of the present invention are prone to crystallize when the layer thickness exceeds approximately 10 nm. The different refractory oxide layers are each individually resistant to corrosive etching; however, grain boundaries in the material layers form sites like pinholes that can act as conduits for fluid transport. It is thought that the improved reliability of thermal actuators observed when laminate films of hafnium oxide (or zirconium oxide) and tantalum oxide are coated on the printhead is a result of the lower density of mesoscopic defects or pinholes that are present in the laminate film. The lower defect density is attributed to the fact that the individual layers of hafnium oxide and tantalum oxide are so thin that they do not crystallize. It is further thought that by alternating layers of the hafnium oxide with layers of tantalum oxide, the difference in atomic arrangement for the two materials further inhibit the crystallization of each, and therefore the total number of fluid conducting regions is minimized in the laminate. It is also thought that if there are any remaining fluid conducting regions formed in the individual material layers, the chances of them aligning on top of each other is small, thereby providing a tortuous path for fluid diffusion so that fluid transport from one layer to another is unlikely which results in improved reliability of the thermal actuator with respect to corrosion and chemical dissolution processes.

In another preferred embodiment of the invention, shown in FIG. 8, an adhesion promoting layer is employed to improve adhesion of the corrosion resistant coating comprised of at least one pair of alternating layers of either hafnium oxide or zirconium oxide and tantalum oxide to the material layer of the printhead, said adhesion promoting layer being located between the laminate coating and the printhead. The adhesion promoting layer may overlay the printhead, the material layer, liquid chamber, nozzle and nozzle bore, or the drop forming mechanism. The printhead, the material layer, liquid chamber, nozzle and nozzle bore, and the drop forming mechanism may also be called a substrate and is known as a substrate for the adhesion promoting film. Suitable adhesion promoting layers may be inorganic or organic films—that is, carbon containing and non-carbon containing films—having any thickness but possessing the essential characteristic that the adhesion promoting film has excellent adhesion promoting properties and adheres to both the printhead and the chemically resistant protective layer comprised of layer(s) of hafnium oxide or zirconium oxide and layer(s) of tantalum oxide. Thinner adhesion promoting films are preferred when adhesion promoting films are employed for the purpose of improving adhesion to thermal actuators of the drop forming mechanism in ink jet printheads although it is recognized that some applications may required adhesion promoting films that are several microns thick. The thickness of an adhesion promoting films is thus best determined by the intended application.

Adhesion promoting layers need not be continuous films, coatings or layers and may be preferentially located and/or spatially localized in preferred regions so as to best enable and enhance the adhesion between the material layer which is also called a substrate and the overlaying non-adhesion promoting film, layer, or coating. Films that are spatially localized, non-uniform over a surface area, or preferentially located on a substrate are also known as patterned films. Patterned adhesion promoting films may, therefore, be fabricated by any method known in the art in order to improve and promote adhesion during use of said adhesion promoting films.

In a preferred embodiment, an adhesion promoting layer is comprised of essentially silicon oxide, having a thickness of at least 0.2 nm. The silicon oxide layer allows surface hydroxl groups to be present during the initial stages of film formation, which is particularly advantageous for atomic layer deposition film forming processes, thereby producing covalent bonding of the corrosion resistant film to the surface. Other adhesion promoting films are well known in the art, including polymer films, self-assembled monolayers of silicon containing silane based adhesion promoting agents or other adhesion promoting agents or molecules, vapor priming films that are well known in the art of semiconductor fabrication methods, including hexamethyldisiloxane based adhesion promoting films, metal and metal oxide adhesion promoting films, and molecular based adhesion promoting films.

Both activated and unactivated adhesion promoting films may be applied to enable adhesion of the laminate coating to the material layer of the printhead. Activated adhesion promoting materials improve their adhesion upon exposure to a secondary stimulus that may be chemical or physical. Such adhesion promoting films may be chemically activated, photochemically activated, thermally activated, pressure activated, plasma activated, or activated by chemical conversion processes well known in the art of chemical conversion coatings for adhesion promotion or activated to promote adhesion by any other means known in the art including plasma treatment of any type, ion bombardment, electron bombardment, or exposure to other actinic radiation. It is specifically contemplated and therefore within the scope of this disclosure that patterned and unpatterned adhesion promoting layers comprised of organic, inorganic, or a combination of inorganic and organic materials that are sometimes called composite adhesion promoting materials may be formed from any suitable starting materials using any fabrication or deposition technique known in the art of formulation and deposition of adhesion promoting films and layers.

FIG. 8 illustrates a cross-sectional view of an embodiment of the present invention with an adhesion promoting layer 90. An inkjet printhead nozzle plate 70 comprised of a material layer 71 and a resistive heater drop forming mechanism 74 located on or in the material layer has an adhesion promoting layer 90 between the material layer 71 and a chemically resistant protective layer 82. The chemically resistant layer 82 is comprised of at least one thin film layer comprised primarily of hafnium oxide or zirconium oxide in contact with at least one thin film layer comprised primarily of tantalum oxide, and the material layer 71 is a wall of a liquid chamber 60, the liquid chamber 60 including a nozzle 64. The adhesion promoting layer 90 is interposed between the chemically resistant laminate layer 82 and the material layer 71. The liquid chamber 60 is in fluid communication with a fluid reservoir 50 (FIG. 2) containing ink or other fluids employed in the digitally controlled printing system 30. In a preferred embodiment, the chemically resistant laminate layer 82 overlies the adhesion promoting layer 90 and the drop forming mechanism 62 which is comprised of a resistive heater thermal actuator 74. The chemically resistant protective layer 82 may be a combination layer comprising several alternating layers, films, or coatings consisting essentially of hafnium oxide or zirconium oxide and consisting essentially of tantalum oxide thereby forming a complex laminate comprised of multiple layers of oxides of refractory metals selected from distinct groups of the Periodic Table.

In a preferred embodiment of the invention, a wear and abrasion resistant layer, coating, or film may be in contact with the printhead on at least one surface of the printhead, said printhead comprising a material layer, a drop forming mechanism, a liquid chamber, a nozzle and nozzle bore, an optional adhesion promoting layer, and an corrosion resistant laminate coating, film, or layer, said corrosion resistant laminate film comprised of at least one thin film layer of hafnium oxide or zirconium oxide and at least one thin film layer of tantalum oxide. The wear resistant and abrasion resistant layer is preferably overlaying and in contact with the corrosion resistant coating that overlays the printhead to provide protection of the printhead, nozzle plate, nozzles, drop forming mechanism, and additionally any integrated circuits or electronics present on the printhead, nozzle plate and drop forming mechanism.

The wear resistant and abrasion resistant layer, film, or coating may be comprised of any material known in the art to provide protection against wear and abrasion on printheads. Wear and abrasion resistant materials typically fall into two different categories: 1) hard materials with a shear modulus greater than at least one element of the printhead itself, said element being selected from the material layer, drop forming mechanism, or integrated circuits present in or on the material layer or 2) tough, energy absorbing materials whose elastic modulus is substantially greater than that of at least one element of the printhead, said element being selected from the material layer, the drop forming mechanism, or integrated circuits. Typically, hard materials whose shear modulus is greater than at least one element on the printhead are preferred for use in wear and abrasion resistant coating, layers, and films. In practice, scratch resistance measurements, such as measurement of the load at which a stylus dragged along the coating surface begins to produce mechanical damage and flaking of the coating, film, or layer, are suitable for the characterization of wear and abrasion resistant layers. Wear and abrasion resistant layers may be formed from dielectric materials, such as silicon nitride, or silicon doped diamond-like carbon (Si-DLC) having a thickness ranging from about 100 to about 600 nm thick. Wear and abrasion resistant layers may also be formed from non-dielectric materials such as plasma deposited titanium nitride, zirconium nitride, or metallic carbides.

Wear and abrasion resistant layers may contain organic or inorganic compounds. Compounds such as polymers or stacked molecular assemblies can be advantageous for wear and abrasion resistance. Polymers and/or resins can be organic, inorganic, or a combination of both. Wear and abrasion resistant polymers and resins include simple aliphatic polymers such as polybutylenes, polyethylenes; polypropylenes and the like; polymers and resins derived from vinyl based monomers; polystyrenes; polyesters; polyurethanes; polyimides; epoxies; polyamide resins; polyether ether ketone polymers and other thermoplastic based polymers; cellulosic polymers; amino resins; acrylic resins; polycarbonates; liquid crystalline polymers and the like; fluorocarbon based polymers an example of which is VITON; silicone based polymers containing any type of polysiloxane polymeric chain; fiber glass composites; acetal resins; phenolic resins; polymers modified with filler compounds such as glass particles or nanoscale particle additives such as carbon nanotubes; and the like.

Wear and abrasion resistant layers can also be comprised of laminates such as the highly wear resistant coatings based on sputtered zirconium oxide-aluminum oxide laminates described by Aita. A preferred wear and abrasion resistant layer is comprised essentially of carbon, silicon, and hydrogen with the stoichiometry $Si_xC_y$:fH where $2>x \geq y$ and $2 \geq (x/y) \geq 1$ and $(x+y)>f$. Another preferred abrasion and wear resistant coating is comprised of essentially of silicon, carbon and nitrogen having stoichiometry $Si_xC_yC_z$:fH and $x+y+z=1$, $x>(y+z)$, $0.6>y>0.1$, $0.6>z>0.05$ and $(x+y+z)>f$. An additional preferred wear and abrasion resistant layer is silicon doped diamond-like carbon (Si-DLC). It is specifically contemplated and therefore within the scope of this disclosure that wear and abrasion resistant layers comprised of organic, inorganic, or a combination of inorganic and organic materials that are sometimes called composite wear and abrasion resistant promoting materials may be formed from any suitable starting materials using any fabrication or deposition technique known in the art of formulation and deposition of wear and abrasion resistant films and layers.

FIG. 9 illustrates a cross-sectional view of a preferred embodiment of the present invention, having a wear and abrasion resistant coating. An inkjet printhead nozzle plate 70 comprised of a material layer 71 and a resistive heater 74 drop forming mechanism 62 located on or in a material layer has an adhesion promoting layer 90 and a chemically resistant protective layer 82 where the chemically resistant layer is comprised of at least one layer of either hafnium oxide or zirconium oxide in contact with at least one layer of tantalum oxide. The adhesion promoting layer 90 is interposed between the chemically resistant laminate layer 82 and the material layer 71. The material layer forms a portion of the wall of the walls of the liquid chamber 60, and includes a nozzle 64, and a drop forming mechanism 62, typically a heater 74; the adhesion promoting layer 90 contacting both the chemically resistant layer 82 and the printhead material layer 71. The liquid chamber 60 is in fluid communication with a fluid reservoir 50 (FIG. 2) containing ink or other fluids employed in the digitally controlled printing system 30. In a preferred embodiment, the chemically resistant laminate layer 82 overlays the adhesion promoting layer 90 and the drop forming mechanism 62 comprised of a resistive heater thermal actuator 74 and the chemically resistant protective layer 82 may be a combination of several material layers comprised of alternating layers, films, or coatings of essentially of hafnium oxide or zirconium oxide and tantalum oxide thereby forming a more complex laminate comprised of multiple layers of refractory oxides. The chemically resistant protective layer 82 and adhesion promoting layer 90 are interposed between the material layer 71 and the wear and abrasion resistant layer 92 with the chemically resistant layer 82 contacting the wear and abrasion resistant layer 92 and the adhesion promoting layer 90 contacting the material layer 71. FIG. 9 illustrates wear and abrasion resistant layer 92 covering all surfaces of the chemically resistant layer 82, i.e., both internal surfaces of liquid chamber 60 as well as external surfaces of the nozzle plate 70. In other embodiments, a wear and abrasion resistant layer 92 may be provided selectively only to the external surfaces of the nozzle plate 70 (thus enabling coating processes which may otherwise not be able to coat such internal surfaces), as internal surfaces of liquid chamber 60 may not be subjected to significant physical wear and abrasion, and chemically resistant layer 82 is sufficient to provide both chemical resistance as well as sufficient physical wear and abrasion protection to the internal surfaces of liquid chamber 60.

Although it is not shown in FIG. 9, an adhesion promoting layer may be present and interposed and in contact with both the chemically resistant layer 82 (comprised of alternating layers, films, or coatings of hafnium oxide or zirconium oxide and tantalum oxide thereby forming a complex laminate comprised of multiple layers of refractory oxides) and the wear and abrasion resistant layer 92, thereby providing improved adhesion of the wear and abrasion resistant layer to the chemically resistant layer. Suitable adhesion promoting layers may be inorganic or organic films as described above for the adhesion promoting layer 90 in FIG. 8, in this instance selected to possess the essential characteristic that the adhesion promoting film has excellent adhesion promoting properties and adheres to both the wear and abrasion resistant layer and the chemically resistant protective layer.

In the illustration in FIG. 9, the printhead is overlaid with an adhesion promoting layer 90, a chemically resistant protective laminate layer 82, and a wear and abrasion resistant layer 92. These three layers can provide a thermally stable, chemically resistant, wear and abrasion resistant coating for the printhead that can protect the printhead from various failures. The chemically resistant laminate protective layer is effective to prevent the fluid or other contaminants from adversely affecting the operation and electrical properties of the resistive heater thermal actuators of the drop forming mechanism on or in the material layer of the printhead and the wear and abrasion resistant protective layer, film, or coating provides protection from mechanical abrasion or shocks from fluid bubble collapse. While FIG. 9 illustrates abrasion resistant layer 92 coated over chemically resistant layer 82, the order of these layers may be reversed in further embodiments of the invention, e.g., where desired for manufacturing convenience, and still provide robust combined abrasion and chemical resistance during operation of the printhead.

EXAMPLES OF THE PRESENT INVENTION

Silicon wafers were coated with 300 nm of aluminum or aluminum-copper alloy. The metalized wafers were then coated with 200 nm of silicon oxide prepared by chemical vapor deposition from tetraethylorthosilane. The silicon oxide was deposited on top of the aluminum or aluminum-copper alloy. These silicon wafers were used as silicon wafer substrates for evaluation of the corrosion resistance and mechanical properties of various films, including laminate films. In examples 1A-1F and example 2 the 200 nm of silicon oxide layer on the substrate wafers is an adhesion promoting layer that enables corrosion resistant surface coatings and films to adhere well to the wafer substrate. The outermost layer of the wafer substrates in examples 1A-1F and example 2, comprised of a $SiO_2$ adhesion promoting layer, was then coated with a corrosion resistant film. Various types of corrosion resistant films that were evaluated are given in examples 1A through 1F. In examples 1A-1F and example 2, test coupons of the substrates and films were cut from the wafers. The corrosion resistance of films in examples 1A-1F was evaluated through exposure of the test coupons of the films to hot caustic test solution (pH11.8 at 80° C.) for a set period of time (48 hrs) followed by optical counting of the total number of corrosion attack sites on the sample. Mechanical properties of the films in example 2 were evaluated by determining the load at which mechanical failure of the film appearance when scratched with a stylus. All methods used for film evaluation are known to those skilled in the art. Films in example 1A-1F and example 2 were prepared by either chemical vapor deposition methods like those described by Bau et al (S. Bau, S. Janz, T. Kieliba, C. Schetter, S. Reber, and F. Lutz; WCPEC3-conference, Osaka, May 11-18(2003); "Application of PECVD-SiC as Intermediate Layer in Crystalline Silicon Thin-Film Solar Cells") or atomic layer deposition methods like those described by Liu et al (X. Lui, S. Ramanathan, A. Longdergan, A. Srivastava, E. Lee, T. E. Seidel, J. T. Barton, D. Pang, and R. G. Gordon; J. Electrochemical Soc, 152(3) G213-G219, (2005); "ALD of Hafnium Oxide Thin Films from Tetrakis(ethylmethylamino)hafnium and Ozone") and these preparative methods are well known to those skilled in the art of semiconductor fabrication.

Example 1A-1F

This example demonstrates the use of an adhesion promoting layer in combination with an improved corrosion resistant laminate film comprised of multiple layers each consisting essentially of $HfO_2$ or $Ta_2O_5$, and demonstrates at least one preferred composition of a corrosion resistant laminate as described in the invention. This example also demonstrates that the relative thickness, order and number of the refractory oxide layers in the invention is important with regard to achieving optimal results, and that the observed improved corrosion resistance of the laminate films, and in particular of hafnium oxide rich $HfO_2$—$Ta_2O_5$ laminate films, is novel and could not have been predicted.

In examples 1A-1F the 200 nm of silicon oxide layer of the silicon wafer substrate described above is an adhesion promoting layer that enables corrosion resistant surface coatings and films that are deposited on top of the silicon wafer to adhere well to the wafer substrate. The outermost layer of the wafer substrates in examples 1A-1F, comprised of a $SiO_2$ adhesion promoting layer, was then coated with a corrosion resistant film. Various types of corrosion resistant films were deposited for evaluation and the various films are given in examples 1A through 1F. Films in examples 1A-1F were deposited by atomic layer deposition methods using the methods described by Liu et al (X. Lui, S. Ramanathan, A. Longdergan, A. Srivastava, E. Lee, T. E. Seidel, J. T. Barton, D. Pang, and R. G. Gordon; J. Electrochemical Sac, 152(3) G213-G219, (2005); "ALD of Hafnium Oxide Thin Films from Tetrakis(ethylmethylamino)hafnium and Ozone") that are well known to those skilled in the art of semiconductor fabrication. Test coupons of the substrates and films were cut from the wafers. The corrosion resistance of films was evaluated through exposure of the surface of the test coupons of the films to hot caustic test solution (pH11.8 at 80° C.) for a set period of time (48 hrs) followed by optical counting of the total number of corrosion attack sites on the coupon sample.

Table 1 shows the relative corrosion resistance of several corrosion resistant films that were evaluated.

TABLE 1

| Example | Surface film description (outermost layer) | Relative defect density (attacks/sq mm) |
|---|---|---|
| 1A | $HfO_2$ 20 nm | 23 |
| 1B | 6 nm $HfO_2$ + 1 nm $Ta_2O_5$ + 6 nm $HfO_2$ + 1 nm $Ta_2O_5$ + 6 nm $HfO_2$ | 4 |
| 1C | 6 nm $HfO_2$ + 1 nm $Ta_2O_5$ + 6 nm $HfO_2$ + 1 nm $Ta_2O_5$ + 6 nm $HfO_2$ + 1 nm $Ta_2O_5$ + 6 nm $HfO_2$ + 1 nm $Ta_2O5$ + 6 nm $HfO_2$ + 1 nm $Ta2O5$ + 6 nm $HfO_2$ | 1 |
| 1D | 6 nm $Ta_2O_5$ + 1 nm $HfO_2$ + 6 nm $Ta_2O_5$ + 1 nm $HfO_2$ + 6 nm $Ta_2O_5$ + 1 nm $HfO_2$ + 6 nm $Ta2O5$ + 1 nm $HfO2$ + 6 nm $Ta2O5$ + 1 nm $HfO2$ + 6 nm $Ta2O5$ | 13 |
| 1E | 6 nm $Ta_2O_5$ + 1 nm $HfO_2$ + 6 nm $Ta_2O_5$ + 1 nm $HfO_2$ + 6 nm $Ta_2O_5$ | 14 |
| 1F | $Ta_2O_5$ 20 nm | 24 |

Comparison of example 1A and 1F with examples 1B-1E demonstrates that multilayered coatings and films (laminate films) of $HfO_2$ and $Ta_2O_5$ show a lower defect density after testing than single layer films of either $HfO_2$ or $Ta_2O_5$ of equivalent total thickness. Table 1 shows that laminate films exhibit significantly fewer corrosion attack sites per square mm than either films comprised of the binary oxide alone, thus demonstrating that the laminate films described in Table 1 are significantly more corrosion resistant than either $HfO_2$ or $Ta_2O_5$ films alone. Comparison of example 1C with example 1D and additional comparison of example 1B with example 1 E demonstrates that the order and identity of the layers in a multilayer film comprised essentially of $HfO_2$ and $Ta_2O_5$ is important in determining the corrosion resistant performance of the laminate films. While improved corrosion resistance is demonstrated for the laminate films of each of Examples 1B through 1E relative to either $HfO_2$ or $Ta_2O_5$ films alone, further improved corrosion resistant is found when the thickness of the hafnium oxide layer is greater than the thickness of the tantalum oxide layer. Examples 1D and 1E in Table 1, where the layer thickness of $HfO_2$ is less than the layer thickness of $Ta_2O_5$, demonstrate that for certain types of laminate structures the number of layers in the laminate structure does not strongly influence the corrosion resistance of this particular type laminate structure. In contrast to this, examples 1B and 1C clearly show that increasing the total number of layers in the laminate structures where the layer thickness of $HfO_2$ is greater than the layer thickness of $Ta_2O_5$ increases the corrosion resistance of the overall laminate film. The behavioral contrast between the examples in Table 1 and specifically between the pairs of examples (1D, 1E) and (1B, 1C) demonstrates that the improved corrosion resistance of the hafnium rich $HfO_2$—$Ta_2O_5$ laminate films in accordance with a preferred embodiment of the invention could not have been predicted.

X-ray diffraction studies of the examples 1A through 1E for phase identification of crystalline oxides showed that only example 1A was crystalline. Example 1A contained crystalline $HfO_2$. Examples 1B through 1E did not show any evidence of crystalline oxide phases by x-ray diffraction. Temperature dependent x-ray diffraction studies of samples 1B through 1E showed that no significant structural changes were observed by x-ray diffraction at temperatures up to 350° C. thereby demonstrating that the $HfO_2$ and $Ta_2O_5$ containing chemically resistant and corrosion resistant laminate films are thermally stable also.

Example 2

This example demonstrates the use a wear and abrasion resistant coating on a chemically resistant, corrosion resistant laminate film as described in an embodiment of the invention.

Two silicon wafers with multilayer corrosion resistant films identical to example 1C were fabricated and one of the wafers was overcoated with 400 nm of an abrasion resistant coating containing silicon, nitrogen, and carbon at 320° C. The overcoat film containing silicon, nitrogen and carbon was prepared by chemical vapor deposition methods like those described by Bau et al (S. Bau, S. Janz, T. Kieliba, C. Schetter, S. Reber, and F. Lutz; WCPEC3-conference, Osaka, May 11-18(2003); "Application of PECVD-SiC as Intermediate Layer in Crystalline Silicon Thin-Film Solar Cells"). The 200 nm of silicon oxide layer on the silicon wafer substrate is an adhesion promoting layer that is at least 0.2 nm in thickness and enables corrosion resistant surface coatings and films that are deposited on top of the silicon wafer to adhere well to the wafer substrate. The wear and abrasion resistant coating containing silicon, carbon and nitrogen overlays and is in contact with the chemically resistant and corrosion resistant coating, including a layer essentially of hafnium oxide and a layer essentially of tantalum oxide. Test coupons of the substrates and films were cut from the wafers. X-ray diffraction studies of the sample did not show evidence of any crystalline oxide films being present in the samples. Mechanical properties of the films on coupon samples were evaluated by determining the load at which mechanical failure of the film appeared when scratched with a stylus. The 400 nm thick wear and abrasion resistant coating was determined to be either poorly crystalline or amorphous by x-ray power diffraction and was analyzed for silicon, carbon, and nitrogen by x-ray photoelectron spectroscopy (XPS). The coating had 40 atomic percent (At %) carbon, 16 At % nitrogen, 6.5 At % oxygen, and 37.5 At % silicon. Hydrogen was not detectable in the coating by XPS. The load to failure as determined by the observation of mechanical flaking of the sample surface was determined using a 10 micron diamond stylus. The wafer, which was overcoated with the 400 nm thick coating containing 37.5 atomic % Si, 40 atomic % carbon, 16 At % nitrogen, and 6.5 At % oxygen, failed at approximately twice the load of the non-overcoated sample that was identical to example 1C. This example demonstrates that 400 nm thick coating containing 37.5 atomic % Si, 40 atomic % carbon, 16 At % nitrogen, and 6.5 At % oxygen is an abrasion and wear resistant coating that can be used to protect an underlying chemically resistant laminate film comprised of thin film layers of $HfO_2$ and $Ta_2O_5$.

Example 3

This example demonstrates the use of an adhesion promoting layer in combination with a corrosion resistant laminate films comprised of multiple layers each consisting essentially of $ZrO_2$ or $Ta_2O_5$. This example also demonstrates corrosion resistant laminate films where a thin film layer of $ZrO_2$ is substituted for $HfO_2$ in the laminate and where $HfO_2$ and $ZrO_2$ are both present as thin films in a laminate structure along with $Ta_2O_5$. In addition, this example demonstrates at least one additional preferred composition of a corrosion resistant laminate as described in the invention.

The outermost layer of the wafer substrates in examples 3A-3E, comprised of a $SiO_2$ adhesion promoting layer, was then coated with a corrosion resistant film. Various types of corrosion resistant films were deposited for evaluation and the various films are given in examples 3A through 3E. Films in examples 3A-3E were deposited by atomic layer deposition methods using the methods described by Liu et al (X. Lui, S. Ramanathan, A. Longdergan, A. Srivastava, E. Lee, T. E. Seidel, J. T. Barton, D. Pang, and R. G. Gordon; J. Electrochemical Soc, 152(3) G213-G219, (2005); "ALD of Hafnium Oxide Thin Films from Tetrakis(ethylmethylamino) hafnium and Ozone") that are well known to those skilled in the art of semiconductor fabrication. Test coupons of the substrates and films were cut from the wafers. The corrosion resistance of films was evaluated through exposure of the test coupons of the films to hot caustic test solution (pH11.8 at 80° C.) for a set period of time (48 hrs) followed by optical counting of the total number of corrosion attack sites on the coupon sample.

Table 2 shows the relative corrosion resistance of several corrosion resistant films that were evaluated according to method described above for examples 1A-1F. The films were deposited on the silicon wafer substrates described above as the outermost layer and were exposed directly to the caustic test solution during evaluation.

TABLE 2

| Example | Surface film description (outermost layer) | Relative defect density (attacks/sq mm) |
|---|---|---|
| 3A | 6 nm $HfO_2$ + 1 nm $Ta_2O_5$ + 6 nm $HfO_2$ + 1 nm $Ta_2O_5$ + 6 nm $HfO_2$ | 3 |
| 3B | 6 nm $ZrO_2$ + 1 nm $Ta_2O_5$ + 6 nm $ZrO_2$ + 1 nm $Ta_2O_5$ + 6 nm $ZrO_2$ | 3 |
| 3C | 6 nm $HfO_2$ + 1 nm $Ta_2O_5$ + 6 nm $HfO_2$ + 1 nm $Ta_2O_5$ + 6 nm $HfO_2$ + 1 nm $Ta_2O5$ + 6 nm $HfO_2$ + 1 nm $Ta2O_5$ + 6 nm $HfO_2$ | 1 |
| 3D | 6 nm $ZrO_2$ + 1 nm $Ta_2O_5$ + 6 nm $ZrO_2$ + 1 nm $Ta_2O_5$ + 6 nm $ZrO_2$ + 1 nm $Ta_2O5$ + 6 nm $ZrO_2$ + 1 nm $Ta2O_5$ + 6 nm $ZrO_2$ | 3 |
| 3E | 6 nm $HfO_2$ + 1 nm $Ta_2O_5$ + 6 nm $HfO_2$ + 1 nm $Ta_2O_5$ + 6 nm $HfO_2$ + 1 nm $Ta_2O5$ + 6 nm $ZrO_2$ + 1 nm $Ta2O_5$ + 6 nm $ZrO_2$ | 2 |

Examples 3A and 3C were replicate examples that are identical with examples 1B and 1C. Examples 3B and 3D in Table 2 similarly demonstrate the corrosion resistance of a dielectric film comprised of multiple alternating layers of zirconium oxide and tantalum oxide that contact each other. Example 3E demonstrates that substitution of $HfO_2$ for $ZrO_2$ in the $ZrO_2$—$Ta_2O_5$ corrosion resistant dielectric laminate film is permissible, while still maintaining the corrosion resistance of the laminate film, with 50% mole substitution of $HfO_2$ for $ZrO_2$ being shown in example 3E. As Example 3E demonstrates intermediate performance between that of Example 3C and Example 3D, it is anticipated that the level of substitution of $HfO_2$ for $ZrO_2$ may be anywhere between 0.1 mole % and 99.9 mole % $HfO_2$ in the $ZrO_2$—$Ta_2O_5$ corrosion resistant dielectric laminate film, with similar intermediate results being expected. Alternately, a level of substitution anywhere between 0.1 mole % and 99.9 mole % of $ZrO_2$ may be substituted for $HfO_2$ in the $HfO_2$—$Ta_2O_5$ corrosion resistant dielectric laminate film while still maintaining the corrosion resistance of the laminate film. Example 3E therefore demonstrates that corrosion resistant laminate films can be prepared in the $HfO_2$—$ZrO_2$—$Ta_2O_5$ system when the level of substitution of zirconium oxide for hafnium oxide in the laminate film is between 0.1 mole % and 99.9 mole %. X-ray diffraction studies of these films gave no evidence for the presence of crystalline oxide phases in the films. Temperature dependent x-ray diffraction studies of samples 3A through 3E showed that the zirconium oxide containing films (examples 3B, 3D, and 3E) crystallized at 300° C. Example 3A and 3C did not show any evidence of crystallization at 350° C. indicating that $HfO_2$ and $Ta_2O_5$ containing chemically resistant and corrosion resistant laminate films have a larger range of thermal stability with respect to crystallization.

Example 4

This example demonstrates improved life of a printhead comprised of a material layer; a drop forming mechanism positioned in or on the material layer; and a multilayer coating including a thin film layer consisting essentially of hafnium oxide and a thin film layer consisting essentially of tantalum oxide, the multilayer coating being located on the material layer.

Three identical CMOS/MEMS integrated inkjet printheads of the type described by Aganostopoulos et al. U.S. Pat. No. 6,502,925 (Jan. 7, 2003) comprising a silicon substrate and silicon-based material layers thereon, with ink channels formed in the substrate and a drop forming mechanism and nozzle opening or bores formed in the material layers, were fabricated. The nozzle openings had a diameter of about 10 micrometers and nozzle bore length of about 5 micrometers, and the ink channels had a length (depth) of about 350 micrometers and an elliptical cross section with a main axis of about 120 micrometers and a minor axis of about 30 micrometers, thus forming microfluidic fluid transport features in the silicon substrate and silicon-based material layers thereon. One of the printheads (inventive Example 4a) was first overcoated with a corrosion resistant laminate film having the same composition as that of example 1C according to the atomic layer deposition methods described in Examples 1 and 3 above, such that surfaces of the material layer, including internal surfaces of the fluid transport features formed in the material layer, are conformally coated with the chemically resistant laminate film. After the corrosion resistant laminate film was applied, a wear and abrasion resistant film was applied to the external surfaces the printhead according to the method described in Example 2 above by overcoating and overlaying the chemically resistant laminate film with 400 nm thick layer containing silicon, nitrogen, and carbon, identical to the wear and abrasion resistant coating described in Example 2. The overcoated layer or film containing silicon, nitrogen and carbon was prepared by chemical vapor deposition methods like those described by Bau et al (S. Bau, S. Janz, T. Kieliba, C. Schetter, S. Reber, and F. Lutz; WCPEC3-conference, Osaka, May 11-18(2003); "Application of PECVD-SiC as Intermediate Layer in Crystalline Silicon Thin-Film Solar Cells"). A second of the printheads (comparison Example 4b) was overcoated with only the 400 nm thick wear and abrasion resistant film (i.e., without first coating a chemically resistant laminate film according to the invention). The third printhead (comparison Example 3c) was not overcoated with either of the chemically resistant laminate film or the wear and abrasion resistant film.

Each of the printheads of Examples 4a-4c were tested under accelerated test conditions. The thermal actuators of the printhead were driven at 480 kHz. The voltage applied to the thermal actuators in the drop forming mechanism was 8V and the dissipated energy in a single heater for a single heater actuation was 26 nanojoules. The test fluid employed, provided at room temperature, contained typical components normally found in fluids formulated for continuous inkjet applications such as Kodak PROSPER inkjet inks (acrylate polymer dispersants, glycerol, polypropylene glycol, triethylene glycol, surfactants, biocide, and anticorrosion agents) at typical concentrations, but had a relatively high concentration of alkali metal cations ($K^+$ concentration approximately 0.2% by weight) for accelerated testing purposes. The test fluid was applied to the print head at 60 psig and reclaimed for reuse after jetting through the print head. After establishing stable jets in each nozzle of the nozzle array of the print head, a 512 nozzle portion of the larger array of heaters was actuated and run continuously until failure. Failure of heaters was detected by monitoring changes in the current drawn by the print head during operation as a function of time.

It was found during testing that although there was no significant difference in the heater life performance of the printheads of comparison Examples 4b and 4c that were prepared with and without the wear and abrasion resistant coating, the printhead of Example 4a including a corrosion resistant laminate coating comprised of at least one thin film layer of $HfO_2$ and at least one thin film layer of $Ta_2O_5$ according to the invention and a wear and abrasion resistant layer showed significantly superior heater life performance when compared with the control printheads of Examples 4b and 4c where the chemically resistant coating was absent. The control printheads of Examples 4b and 4c (with and without the wear and abrasion resistant layer, but in both examples without the corrosion resistant coating) operated 45±15 hours before failure of the thermal actuators in the drop forming mechanism of the printhead, whilst the printhead of Example 4a with both the corrosion resistant coating and the wear resistant coating operated over 200 hours before failure of the thermal actuators in the drop forming mechanism of the printhead during testing—an improvement of greater than a factor of four in the lifetime of the thermal actuators in the drop forming mechanism of the printhead.

The invention has been described in detail with particular reference to certain preferred embodiments thereof, but it will be understood that variations and modifications can be effected within the spirit and scope of the invention.

| PARTS LIST | |
|---|---|
| 10 | Printing System |
| 12 | Cover |
| 14 | Recording Media Supply |
| 16 | Ink Tanks |
| 18 | Printheads |
| 20 | Carriage |
| 22 | Image Data |
| 24 | Printed Media |
| 30 | Printing System |
| 32 | Image Source |
| 34 | Image Processing Unit |
| 36 | Mechanism Control Circuit |
| 38 | Drop Forming Mechanism |
| 40 | Printhead |
| 42 | Recording Medium |
| 44 | Recording Medium Transport System |
| 46 | Recording Medium Transport Control System |
| 48 | Micro-Controller |
| 50 | Ink Reservoir |
| 52 | Ink Catcher |
| 54 | Recycling Unit |
| 56 | Pressure Regulator |
| 57 | Channel |
| 58 | Drop Ejector |
| 60 | Fluid Chamber |
| 62 | Drop Forming Mechanism |
| 64 | Nozzle |
| 66 | Wall |
| 68 | Walls |
| 69 | Material Layer |

PARTS LIST

| | |
|---|---|
| 70 | Nozzle Plate |
| 71 | Material Layer |
| 72 | Body |
| 74 | Heater |
| 76 | Contact Pads |
| 78 | Conductors |
| 80 | Material Layer |
| 82 | Corrosion Resistant Film |
| 84 | Hafnium Oxide Layer |
| 86 | Tantalum Oxide Layer |
| 88 | Zirconium Oxide |
| 90 | Adhesion Layer |
| 92 | Wear Resistant Layer |

The invention claimed is:

1. A printhead comprising:
a material layer;
a drop forming mechanism positioned in or on the material layer; and
a multilayer coating including alternating thin film layers of two or more thin film layers comprised primarily of hafnium oxide or zirconium oxide and of two or more thin film layers comprised primarily of tantalum oxide, the multilayer coating being located on the material layer; wherein the alternating thin film layers do not show evidence of crystalline oxide phases in the film layers by X-ray diffraction.

2. The printhead of claim 1, wherein the multilayer coating includes at least a first thin film layer comprised primarily of hafnium oxide or zirconium oxide and a second thin film layer comprised primarily of tantalum oxide that overlay and contact each other.

3. The printhead of claim 2, wherein the second thin film layer comprised primarily of tantalum oxide overlays the first thin film layer comprised primarily of hafnium oxide or zirconium oxide, and the multilayer coating further comprises an additional thin film layer comprised primarily of hafnium oxide or zirconium oxide overlaying and in contact with the second thin film layer comprised primarily of tantalum oxide.

4. The printhead of claim 2, wherein first thin film layer comprised primarily of hafnium oxide or zirconium oxide overlays the second thin film layer comprised primarily of tantalum oxide, and the multilayer coating further comprises an additional thin film layer comprised primarily of tantalum oxide overlaying and in contact with the first thin film layer comprised primarily of hafnium oxide or zirconium oxide.

5. The printhead of claim 2, wherein the thickness of the first thin film layer comprised primarily of hafnium oxide or zirconium oxide is greater than the thickness of the second thin film layer comprised primarily of tantalum oxide.

6. The printhead of claim 5, wherein a ratio of the thickness of the first thin film layer comprised primarily of hafnium oxide or zirconium oxide and the thickness of the second thin film layer comprised primarily of tantalum oxide is greater than or equal to 2 and less than 100.

7. The printhead of claim 5, wherein the thickness of each of the two or more thin film layers comprised primarily of hafnium oxide or zirconium oxide and each of the two or more thin film layers comprised primarily of tantalum oxide is less than 10 nanometers.

8. The printhead of claim 7, wherein the thickness of one of the thin film layers including hafnium oxide or zirconium oxide is at least 2 nanometers.

9. The printhead of claim 7, wherein the total thickness of the multilayer coating is from 10 nanometers to less than 100 nanometers.

10. The printhead of claim 7, wherein the total thickness of the multilayer coating is from 10 nanometers to less than 50 nanometers.

11. The printhead of claim 1, wherein the multilayer coating includes two or more thin film layers consisting essentially of hafnium oxide.

12. The printhead of claim 1, wherein the multilayer coating includes two or more thin film layers consisting essentially of zirconium oxide.

13. The printhead of claim 1, further comprising:
an adhesion promoting layer located between the material layer and the multilayer coating.

14. The printhead of claim 1, further comprising:
an abrasion resistant layer overlaying and in contact with the multilayer coating.

15. The printhead of claim 14, wherein the abrasion resistant layer comprises a silicon carbide layer.

16. The printhead of claim 1, further comprising:
an adhesion promoting layer overlaying and in contact with the multilayer coating; and
an abrasion resistant layer overlaying and in contact with the adhesion promoting layer.

17. The printhead of claim 1, wherein the material layer comprises a silicon-based material layer.

18. The printhead of claim 1, wherein the material layer is a nozzle plate including a nozzle bore and the drop forming mechanism is positioned about the nozzle bore.

19. The printhead of claim 1, wherein the material layer is a wall of a liquid chamber, the liquid chamber including a nozzle.

* * * * *